(12) United States Patent
Meya et al.

(10) Patent No.: US 8,927,200 B2
(45) Date of Patent: Jan. 6, 2015

(54) DOUBLE PATTERNING METHOD

(71) Applicant: JSR Corporation, Tokyo (JP)

(72) Inventors: Kanako Meya, Tokyo (JP); Takeo Shioya, Tokyo (JP); Motoyuki Shima, Tokyo (JP)

(73) Assignee: JSR Corporation, Tokyo (JP)

(*) Notice: Subject to any disclaimer, the term of this patent is extended or adjusted under 35 U.S.C. 154(b) by 0 days.

(21) Appl. No.: 14/059,596

(22) Filed: Oct. 22, 2013

(65) Prior Publication Data

US 2014/0080066 A1    Mar. 20, 2014

Related U.S. Application Data

(63) Continuation of application No. PCT/JP2012/061287, filed on Apr. 26, 2012.

(30) Foreign Application Priority Data

May 18, 2011 (JP) ................................. 2011-111925

(51) Int. Cl.
*G03F 7/26* (2006.01)
*G03F 7/20* (2006.01)
*H01L 21/027* (2006.01)

(52) U.S. Cl.
CPC .......... *G03F 7/2022* (2013.01); *H01L 21/0274* (2013.01)
USPC ............ 430/315; 430/394; 430/325; 430/330

(58) Field of Classification Search
CPC ....... G03F 7/0035; G03F 7/11; G03F 7/2041; G03F 7/095; G03F 7/322; G03F 7/40; G03F 7/70341; G03F 7/70466; G03F 7/004; G03F 7/0382; G03F 7/2022; G03F 7/405; H01L 21/0273; H01L 21/0337; H01L 21/00; H01L 21/0271; H01L 21/308; H01L 21/3086; H01L 21/3088; Y10S 430/136; Y10S 430/162; Y10S 430/114; Y10S 430/128

USPC .......................... 430/323, 325, 315, 328, 394
See application file for complete search history.

(56) References Cited

U.S. PATENT DOCUMENTS

2006/0024616 A1* 2/2006 Clark et al. .................... 430/311
2009/0170034 A1* 7/2009 Lim .............................. 430/313
(Continued)

FOREIGN PATENT DOCUMENTS

JP         11-283910         10/1999
JP         2008-078220        4/2008
(Continued)

OTHER PUBLICATIONS

Sungkoo Lee et al., "Double exposure technology using silicon containing materials", Proc. SPIE 6153, Advances in Resist Technology and Processing XXIII, vol. 6153, 61531K, 2006; doi:10.1117/12.657077.

(Continued)

*Primary Examiner* — Caleen Sullivan
(74) *Attorney, Agent, or Firm* — Oblon, Spivak, McClelland, Maier & Neustadt, L.L.P.

(57) ABSTRACT

A double patterning method includes providing a first resist film on a substrate using a first photoresist composition. The first resist film is exposed. The exposed first resist film is developed using a first developer to form a first resist pattern. A second resist film is provided in at least space areas of the first resist pattern using a second photoresist composition. The second resist film is exposed. The exposed second resist film is developed using a second developer that includes an organic solvent to form a second resist pattern. The first resist pattern is insoluble or scarcely soluble in the second developer.

14 Claims, 2 Drawing Sheets

(56) References Cited

U.S. PATENT DOCUMENTS

2009/0253080 A1* 10/2009 Dammel et al. .............. 430/324
2009/0258318 A1* 10/2009 Chan ............................ 430/312

FOREIGN PATENT DOCUMENTS

| JP | 2008-292975 | 12/2008 |
| JP | 2009-069817 | 4/2009 |
| JP | 2012-053307 | 3/2012 |
| WO | WO 2010/032839 | 3/2010 |

OTHER PUBLICATIONS

International Search Report for corresponding International Application No. PCT/JP2012/061287, Jun. 26, 2012.

* cited by examiner

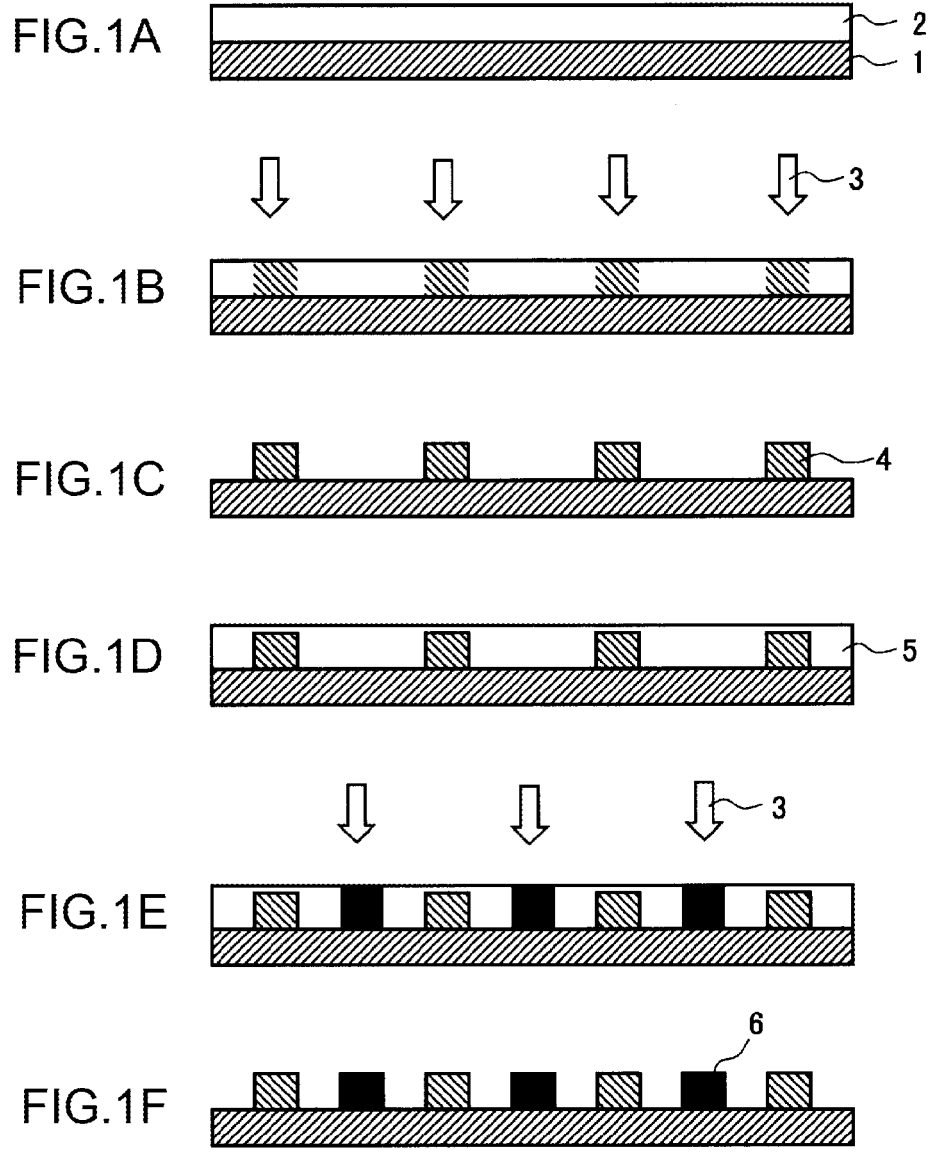

FIG.2C1 
FIG.2C2 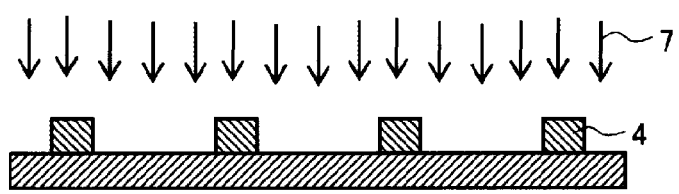

FIG.2F ated Application No. PCT/JP2012/061287, filed
DOUBLE PATTERNING METHOD

CROSS-REFERENCE TO RELATED APPLICATIONS

The present application is a continuation application of International Application No. PCT/JP2012/061287, filed Apr. 26, 2012, which claims priority to Japanese Patent Application No. 2011-111925, filed May 18, 2011. The contents of these applications are incorporated herein by reference in their entirety.

BACKGROUND OF THE INVENTION

1. Field of the Invention

The invention relates to a double patterning method.

2. Discussion of the Background

A reduction in dimensions of a resist pattern used for a lithographic process has been desired along with miniaturization of various electronic device structures (e.g., semiconductor devices and liquid crystal devices). A fine resist pattern having a line width of about 90 nm can be formed using a chemically-amplified photoresist composition, and using ArF excimer laser light or the like as exposure light. However, a finer resist pattern will be required in the future.

In recent years, a double patterning technique that forms a resist pattern two or more times has been proposed as a technique that improves the resolution of a resist pattern (see SPIE 2006 61531K). The double patterning technique repeats a patterning process that forms a resist film using a positive-tone resist composition, and subjects the resist film to exposure and alkali development. It is considered that a resist pattern having a resolution higher than that of a resist pattern formed by a single patterning process can be formed by the double patterning technique.

However, the double patterning technique has a problem in that deformation, dissolution, or the like of the first resist pattern may occur when forming the second resist pattern due to the solvent included in the photoresist composition, the effects of exposure, or the like, and a large difference in pattern height may occur, or the pattern may not have a rectangular cross-sectional shape. The double patterning technique has another problem in that it is difficult to form a pattern having both a narrow area and a wide area.

In order to solve the above problems, a technique that insolubilizes the surface of the first resist pattern (see Japanese Patent Application Publication (KOKAI) No. 2009-69817), and a technique that forms the second resist pattern using a negative-tone resist composition that includes an alcohol-based organic solvent (see Japanese Patent Application Publication (KOKAI) No. 2008-78220) have been proposed.

SUMMARY OF THE INVENTION

According to one aspect of the present invention, a double patterning method includes providing a first resist film on a substrate using a first photoresist composition. The first resist film is exposed. The exposed first resist film is developed using a first developer to form a first resist pattern. A second resist film is provided in at least space areas of the first resist pattern using a second photoresist composition. The second resist film is exposed. The exposed second resist film is developed using a second developer that includes an organic solvent to form a second resist pattern. The first resist pattern is insoluble or scarcely soluble in the second developer.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

FIG. 1A, FIG. 1B, FIG. 1C, FIG. 1D, FIG. 1E, and FIG. 1F are schematic views illustrating a double patterning method according to one embodiment of the invention.

FIG. 2A, FIG. 2B, FIG. 2C1, FIG. 2C2, FIG. 2D, FIG. 2E, and FIG. 2F are schematic views illustrating a double patterning method according to one embodiment of the invention.

DESCRIPTION OF THE EMBODIMENTS

Figure 2A:

According to one embodiment of the invention, a double patterning method includes:
  forming a first resist pattern; and
  forming a second resist pattern,
  the forming of the first resist pattern including:
    (1a) forming a first resist film on a substrate using a first photoresist composition (hereinafter may be referred to as "step (1a)");
    (1b) exposing the first resist film (hereinafter may be referred to as "step (1b)"); and
    (1c) developing the exposed first resist film using a first developer (hereinafter may be referred to as "step (1c)"),
  the forming of the second resist pattern including:
    (2a) applying a second photoresist composition to at least space areas of the first resist pattern to form a second resist film (hereinafter may be referred to as "step (2a)");
    (2b) exposing the second resist film (hereinafter may be referred to as "step (2b)"); and
    (2c) developing the exposed second resist film using a second developer that includes an organic solvent (hereinafter may be referred to as "step (2c)"), and
  the first resist pattern being insoluble or scarcely soluble in the second developer.

According to the double patterning method, since the first resist pattern is insoluble or scarcely soluble in the developer that is used when forming the second resist pattern and includes an organic solvent, it is possible to prevent a situation in which deformation, dissolution, and the like of the first resist pattern occur when forming the second resist pattern. Therefore, the double patterning method can easily and reliably form a resist pattern that shows a small difference in pattern height, has an excellent cross-sectional shape, and has both a narrow area and a wide area.

It is preferable that the first developer be a developer that includes an organic solvent. When the first developer is the above specific developer, an area of the first resist film that exhibits relatively low polarity can be removed to easily form the first resist pattern that is insoluble or scarcely soluble in the second developer.

It is preferable that the first developer be an alkaline developer, and the forming of the first resist pattern further include (1d) exposing the developed first resist film (hereinafter may be referred to as "step (1d)") after the step (1c).

An area of the resist film that exhibits relatively high polarity can be removed by utilizing an alkaline developer as the first developer to obtain the developed first resist film, and the first resist pattern that is insoluble or scarcely soluble in the second developer can be easily formed by exposing the developed first resist film.

It is preferable that the first photoresist composition and the second photoresist composition include [A] a polymer that includes an acid-labile group that dissociates by an action of acid to produce an acidic group (hereinafter may be referred to as "polymer [A]"), [B] an acid generator, and [C] a solvent.

The acid-labile group included in the polymer [A] included in the photoresist composition dissociates by an action of an acid generated by the acid generator [B] upon exposure to produce an acidic group (e.g., carboxyl group), and the polymer [A] becomes insoluble or scarcely soluble in the second developer. Therefore, the double patterning method can be advantageously implemented by utilizing the photoresist composition.

It is preferable that the double patterning method further includes (3) bringing a basic compound into contact with a surface of the developed first resist film (hereinafter may be referred to as "step (3)") before the step (2b).

When the double patterning method further includes the step (3), it is considered that the surface of the developed first resist film interacts with the basic compound, so that a resist pattern can be formed that shows a small difference in pattern height, has an excellent cross-sectional shape, and has both a narrow area and a wide area.

It is preferable that the first developer include an organic solvent and the basic compound, and the step (3) be performed in the step (1c).

It is also preferable that the forming of the first resist pattern include (1c') rinsing the developed first resist film with a rinsing agent (hereinafter may be referred to as "step (1c')") after the step (1c), the rinsing agent include the basic compound, and the step (3) be performed in the step (1c').

It is also preferable that the second photoresist composition include the basic compound, and the step (3) be performed in the step (2a).

When the step (3) is performed in the step (1c), (1c'), or (2a), the surface of the developed first resist film effectively interacts with the basic compound, and the difference in height of the double pattern can be reduced while improving the cross-sectional shape and the width of the double pattern.

It is preferable that the basic compound have higher basicity as compared with a conjugate base of the acidic group produced by dissociation of the acid-labile group included in the polymer [A].

When the basic compound has higher basicity as compared with the conjugate base of the acidic group, it is considered that the surface of the developed first resist film more strongly interacts with the basic compound, and the difference in height of the double pattern can be reduced while improving the cross-sectional shape and the width of the double pattern.

It is preferable that the first resist pattern and the second resist pattern be line-and-space patterns, and line areas of the first resist pattern and line areas of the second resist pattern be alternately disposed.

The double patterning method thus makes it possible to advantageously form a line-and-space pattern having a narrower pitch, for example.

It is preferable that the first resist pattern and the second resist pattern be line-and-space patterns, and line areas of the first resist pattern and line areas of the second resist pattern be disposed to perpendicularly intersect each other.

The double patterning method thus makes it possible to advantageously form a contact hole pattern having high resolution, for example.

As described above, the double patterning method according to the embodiment of the invention can form a resist pattern that shows a small difference in pattern height, has an excellent cross-sectional shape, and has both a narrow area and a wide area. Therefore, the double patterning method may suitably be used for microfabrication that utilizes lithography.

The embodiments will now be described with reference to the accompanying drawings, wherein like reference numerals designate corresponding or identical elements throughout the various drawings.

The double patterning methods according to the embodiments of the invention are described in detail below with reference to FIG. 1A, FIG. 1B, FIG. 1C, FIG. 1D, FIG. 1E, FIG. 1F, FIG. 2A, FIG. 2B, FIG. 2C1, FIG. 2C2, FIG. 2D, FIG. 2E, and FIG. 2F.

Double Patterning Method (A)

A double patterning method (A) includes forming a first resist pattern, and forming a second resist pattern. The forming of the first resist pattern includes the steps (1a) to (1c), and the forming of the second resist pattern includes the steps (2a) to (2c). The double patterning method (A) preferably includes the step (3), and may include the step (1c') and the like. Each step is described in detail below.

Step (1a)

In the step (1a), the first resist film is formed on the substrate using the first photoresist composition. As illustrated in FIG. 1A, the first photoresist composition is applied to a substrate 1 to form a first resist film 2. The first photoresist composition is not particularly limited as long as the resist film formed using the first photoresist composition shows a change in solubility in a developer upon exposure: Examples of the first photoresist composition include a composition that shows a decrease in solubility in a developer that includes an organic solvent, and an increase in solubility in an alkaline developer upon exposure, and the like.

A known substrate such as a silicon wafer or an aluminum-coated wafer may be used as the substrate 1. An organic or inorganic antireflective film may be formed on the substrate.

The first photoresist composition may be applied by spin coating, cast coating, roll coating, or the like. The thickness of the resist film formed using the first photoresist composition is normally 10 to 1000 nm, and preferably 10 to 500 nm.

The resist film formed by applying the first photoresist composition may optionally be soft-baked (SB) to vaporize the solvent from the resist film. The SB temperature is appropriately selected depending on the composition of the photoresist composition, but is normally 30 to 200° C., and preferably 50 to 150° C. The SB time is normally 10 to 600 seconds, and preferably 20 to 300 seconds.

A protective film or the like may be formed on the resist film so that the resist film is not affected by basic impurities and the like contained in the environmental atmosphere. In order to prevent outflow of the acid generator and the like from the resist film during liquid immersion lithography, a liquid immersion lithography protective film may be formed on the resist film, for example. Note that these techniques may be used in combination.

Step (1b)

In the step (1b), the first resist film is exposed. As illustrated in FIG. 1B, the first resist film 2 is exposed (e.g., reduced projection exposure) by applying exposure light 3 to the desired areas of the first resist film 2 formed in the step (1a) through a mask having a specific pattern and an optional immersion liquid. For example, the desired areas of the first resist film 2 may be subjected to reduced projection exposure via a mask having an isolated line pattern to form an isolated trench pattern as the first resist pattern.

Examples of the immersion liquid used for liquid immersion lithography include water, a fluorine-based inert liquid, and the like. It is preferable that the immersion liquid be a liquid that is transparent to the exposure wavelength and has a temperature coefficient of refractive index as small as possible so that distortion of an optical image projected onto the film is minimized. When the exposure light 3 is ArF excimer laser light (wavelength: 193 nm), it is preferable to use water as the immersion liquid from the viewpoint of availability and ease of handling. When using water as the immersion liquid, a small amount of an additive that decreases surface tension and increases surface activity may be added to water.

The exposure light 3 is appropriately selected depending on the type of the acid generator or the like included in the first photoresist composition. Examples of the exposure light 3 include electromagnetic waves such as ultraviolet rays, deep ultraviolet rays, extreme ultraviolet rays, X-rays, and γ-rays, charged particle rays such as electron beams and α-rays, and the like. Among these, deep ultraviolet rays are preferable. It is more preferable to use ArF excimer laser light or KrF excimer laser light (wavelength: 248 nm). It is still more preferable to use ArF excimer laser light. The exposure conditions (e.g., dose) are appropriately selected depending on the photoresist composition, the type of additive, and the like.

The first resist film may be exposed a plurality of times using different types of exposure light 3. It is preferable to initially expose the first resist film using ArF excimer laser light as the exposure light 3.

It is preferable to perform post-exposure bake (PEB) after exposure. The acid-labile group included in the polymer included in the resist film dissociates smoothly due to PEB, for example. The PEB temperature is normally 30 to 200° C., and preferably 50 to 170° C. The PEB time is normally 10 to 600 seconds, and preferably 20 to 300 seconds.

Step (1c)

In the step (1c), the exposed first resist film is developed using the first developer. A first resist pattern 4 (see FIG. 1C) is formed by the step (1c). It is preferable that the first developer include an organic solvent. When the first developer is the above specific developer, an area of the resist film that exhibits relatively low polarity can be removed to easily form the first resist pattern that is insoluble or scarcely soluble in the second developer.

Examples of the organic solvent include alcohol-based solvents, ether-based solvents, ketone-based organic solvents, amide-based solvents, ester-based solvents, hydrocarbon-based solvents, and the like.

Examples of the alcohol-based solvents include monohydric alcohol-based solvents such as methanol, ethanol, n-propanol, isopropanol, n-butanol, isobutanol, sec-butanol, tert-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol-based solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether-based solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ether-based solvents include dialiphatic ethers such as diethyl ether, dipropyl ether, and dibutyl ether; diaromatic ethers such as diphenyl ether and ditolyl ether; aromatic-aliphatic ethers such as anisole and phenyl ethyl ether; and the like.

Examples of the ketone-based solvents include aliphatic ketone-based solvents such as acetone, methyl ethyl ketone, methyl n-propyl ketone, methyl n-butyl ketone, diethyl ketone, methyl isobutyl ketone, methyl amyl ketone, ethyl n-butyl ketone, methyl n-hexyl ketone, diisobutyl ketone, trimethylenonane, cyclopentanone, cyclohexanone, cycloheptanone, cyclooctanone, methylcyclohexanone, 2,4-pentanedione, acetonylacetone, and acetophenone; aliphatic-aromatic ketone-based solvents such as acetophenone, propiophenone, and tolyl methyl ketone; aromatic ketone-based solvents such as benzophenone, tolyl phenyl ketone, and ditolyl ketone; and the like.

Examples of the amide-based solvents include N,N'-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like.

Examples of the ester-based solvents include monoester-based solvents such as methyl acetate, ethyl acetate, n-propyl acetate, isopropyl acetate, n-butyl acetate, isobutyl acetate, s-butyl acetate, n-pentyl acetate, s-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, methoxy triglycol acetate, ethyl propionate, n-butyl propionate, isoamyl propionate, methyl lactate, ethyl lactate, n-butyl lactate, and n-amyl lactate; diester-based solvents such as glycol diacetate, diethyl oxalate, di-n-butyl oxalate, diethyl malonate, dimethyl phthalate, and diethyl phthalate; polyhydric alcohol monoether acetate-based solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, and dipropylene glycol monoethyl ether acetate; lactone-based solvents such as γ-butyrolactone and γ-valerolactone; carbonate-based solvents such as diethyl carbonate, dipropyl carbonate, ethylene carbonate, and propylene carbonate; and the like.

Examples of the hydrocarbon-based solvents include aliphatic hydrocarbon-based solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon-based solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; and the like.

Among these, it is preferable to use an ether-based solvent, a ketone-based solvent, and/or an ester-based solvent. It is preferable to use an aromatic-aliphatic ether-based solvent (particularly preferably anisole) as the ether-based solvent. It is preferable to use an aliphatic ketone-based solvent (particularly preferably methyl amyl ketone) as the ketone-based solvent. It is preferable to use a monoester-based solvent (particularly preferably butyl acetate) as the ester-based solvent. These organic solvents may be used in combination.

The content of the organic solvent in the first developer is preferably 80 mass % or more, more preferably 85 mass % or more, and particularly preferably 90 mass % or more. When the content of the organic solvent in the first developer is within the above specific range, an area of the resist film that exhibits relatively low polarity can be effectively dissolved and removed, and a pattern that exhibits excellent resolution can be formed. Examples of a component of the developer other than the organic solvent include water, silicone oil, and the like. An appropriate amount of a surfactant may optionally be added to the first developer. An ionic or nonionic fluorine-based surfactant and/or a silicone-based surfactant or the like may be used as the surfactant.

Examples of the development method that may be employed in the step (1c) include a dipping method that immerses the substrate in a bath filled with the developer for a given time, a puddle method that allows the developer to be present on the surface of the substrate for a given time due to surface tension, a spray method that sprays the developer onto the surface of the substrate, a dynamic dispensing method that applies the developer to the substrate that is rotated at a constant speed while scanning with a developer application nozzle at a constant speed, and the like.

Step (1c')

The developed resist pattern obtained by the step (1c) may be rinsed with a rinsing agent, and dried (step (1c')). A liquid that includes an organic solvent may be used as the rinsing agent so that scum can be efficiently washed away. Example of the organic solvent include hydrocarbon-based solvents, ketone-based solvents, ester-based solvents, alcohol-based solvents, amide-based solvents, and the like. Among these, alcohol-based solvents and ester-based solvents are preferable, and monohydric alcohol-based solvents having 6 to 8 carbon atoms are more preferable.

Two or more rinsing agents may be used in combination. The water content in the rinsing agent is preferably 10 mass % or less, more preferably 5 mass % or less, and particularly preferably 3 mass % or less. When the water content in the rinsing agent is within the above specific range, excellent developability can be achieved. Note that a surfactant may be added to the rinsing agent.

Examples of the rinsing method using the rinsing agent include a spin method that applies the rinsing agent to the substrate that is rotated at a constant speed, a dipping method that immerses the substrate in a bath filled with the rinsing agent for a given time, a spray method that sprays the rinsing agent onto the surface of the substrate, and the like.

Step (2a)

In the step (2a), the second resist film is formed in at least the space areas of the first resist pattern using the second photoresist composition. As illustrated in FIG. 1D, the second photoresist composition is applied to at least the space areas of the first resist pattern 4 to form a second resist film 5. The step (2a) is performed in the same manner as the step (1a). The second photoresist composition may be identical with the first photoresist composition used in the step (1a), or may differ from the first photoresist composition used in the step (1a). It is preferable that the second photoresist composition be identical with the first photoresist composition and from the viewpoint of facilitating the double pattern-forming process. Note that the expression "the second photoresist composition is identical with the first photoresist composition" means that the second photoresist composition is identical with the first photoresist composition as to the type and the amount of each component, and the expression "the second photoresist composition differs from the first photoresist composition" means that the second photoresist composition differs from the first photoresist composition as to the type or the amount of some component.

In the step (2a), the second photoresist composition may be applied to only the space areas of the first resist pattern 4, or may be applied to the space areas and the upper side of the first resist pattern 4. The thickness of the second resist film 5 may be set independently of the thickness of the first resist film 2.

Step (2b)

In the step (2b), the second resist film is exposed. As illustrated in FIG. 1B, the second resist film 5 formed in the step (2a) is exposed by applying the exposure light 3 to the second resist film 5. The step (2b) is performed in the same manner as the step (1b).

Step (2c)

In the step (2c), the exposed second resist film is developed using the second developer that includes an organic solvent. The step (2c) is performed in the same manner as the step (1c). A second resist pattern 6 (FIG. 1F) is formed by the step (2c). Example of the second developer include the organic solvent-containing developers mentioned above in connection with the first developer used in the step (1c), and the like. In the double patterning method (A), it is preferable that the polarity of the second developer be lower than the polarity of the first developer from the viewpoint of suppressing deformation, dissolution, and the like of the first resist pattern. Note that the polarity of the developer is indicated by the solubility parameter value (SP value) or the like.

The first resist pattern formed by the double patterning method is insoluble or scarcely soluble in the second developer. When the first resist pattern is insoluble or scarcely soluble in the second developer, it is possible to prevent a situation in which deformation, dissolution, and the like of the first resist pattern occur when forming the second resist pattern, and form a double pattern having an excellent shape. Note that the expression "insoluble or scarcely soluble" means that the solubility in the developer is sufficiently low so that the shape of the resist pattern is substantially maintained.

The difference in height between the second resist pattern 6 and the first resist pattern 4 may be adjusted by calculating an appropriate thickness of the resist film 5 from the relationship between the film thickness loss of the resist film 2 in the step (1c) and the film thickness loss of the resist film 5 in the step (2c). It is preferable that the first resist pattern 4 and the second resist pattern 6 have an identical height from the viewpoint of the processability of the substrate after patterning.

Double Patterning Method (B)

A double patterning method (B) (see FIG. 2A, FIG. 2B, FIG. 2C1, FIG. 2C2, FIG. 2D, FIG. 2E, and FIG. 2F) differs from the double patterning method illustrated in FIGS. 1A to 1F in that the first developer is an alkaline developer, and the forming of the first resist pattern further includes (1d) exposing the developed first resist film after the step (1c). The differences from the double patterning method illustrated in FIGS. 1A to 1F are described in detail below.

Step (1b)

Figure 2B:
Figure 2D:
Figure 2E:

In the step (1b), the first resist film is exposed. As illustrated in FIG. 2B, the first resist film 2 is exposed (e.g., reduced projection exposure) by applying exposure light 3 to the desired areas of the first resist film 2 formed in the step (1a) through a mask having a specific pattern and an optional immersion liquid. For example, the desired areas of the first resist film 2 may be subjected to reduced projection exposure via a mask having an isolated line pattern to form an isolated line pattern as the first resist pattern.

Step (1c)

In the step (1c) illustrated in FIG. 2C 1, the exposed first resist film is developed using an alkaline developer as the first developer. An area of the first resist film that exhibits relatively high polarity is dissolved and removed by utilizing the alkaline developer to form a developed first resist film 4' (see FIG. 2C1).

An alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water may be used as the alkaline developer. The concentration of the alkaline aqueous solution is normally 10 mass % or less. If the concentration of the aqueous alkaline solution exceeds 10 mass %, the unexposed area may also be dissolved in the developer. After development using the aqueous alkaline solution, the resist film is preferably rinsed with water, and dried.

The alkaline developer may include two or more organic solvents (e.g., ketones such as acetone, methyl ethyl ketone, methyl i-sobutyl ketone, cyclopentanone, cyclohexanone, 3-methylcyclopentanone, 2,6-dimethylcyclohexanone, and acetonylacetone, alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol, ethers such as tetrahydrofuran and dioxane, esters such as ethyl acetate, n-butyl acetate, and isoamyl acetate, aromatic hydrocarbons such as toluene and xylene, phenol, and dimethylformamide).

The organic solvent is preferably used in an amount of amount 100 parts by volume or less, more preferably 50 parts by volume or less, particularly preferably 25 parts by volume or less, and most preferably 10 parts by volume or less, based on 100 parts by volume of the alkaline developer. If the amount of the organic solvent exceeds 100 parts by volume based on 100 parts by volume of the alkaline developer, a deterioration in alkali developability may occur, and the exposed area may remain undeveloped. Note that an appropriate amount of a surfactant or the like may also be added to the alkaline developer.

Step (1d)

In the step (1d), the developed first resist film is exposed. The developed first resist film 4' is converted by the step (1d) into the first resist pattern 4 that is insoluble or scarcely soluble in the second developer that includes an organic solvent through dissociation of the acid-labile group included in the polymer by an action of an acid generated upon exposure to form a polar group, for example.

The exposure in the step (1d) is performed in the same manner as the exposure in the step (1b). It is preferable to expose the entire area of the first resist film 4' including the space areas from the viewpoint of more reliably converting the first resist film 4' into the first resist pattern 4. The dose is not particularly limited as long as the dose is sufficient to convert the first resist film 4' into the first resist pattern. The dose is normally 0.01 to 10 times the dose used in the step (1b).

It is preferable to perform PEB after exposure. The acid-labile group included in the polymer included in the developed resist pattern dissociates smoothly due to PEB, so that the first resist pattern 4 can be reliably formed, for example.

The PEB temperature is normally 30 to 200° C., and preferably 50 to 170° C. The PEB time is normally 10 to 600 seconds, and preferably 20 to 300 seconds.

The shape of the double pattern obtained by the double patterning method is not particularly limited. It is preferable that the first resist pattern and the second resist pattern be line-and-space patterns, and the line areas of the first resist pattern and the line areas of the second resist pattern be alternately disposed. The double patterning method makes it possible to advantageously form a line-and-space pattern having a narrower pitch, for example.

It is also preferable that the first resist pattern and the second resist pattern be line-and-space patterns, and the line areas of the first resist pattern and the line areas of the second resist pattern be disposed to perpendicularly intersect each other. The double patterning method makes it possible to advantageously form a contact hole pattern having high resolution, for example.

After forming the second resist pattern, the substrate on which the first resist pattern and the second resist pattern are formed may be repeatedly subjected to the second resist pattern-forming process a plurality of times. This makes it possible to form a resist pattern having higher resolution.

Step (3)

In the step (3), a basic compound is brought into contact with the surface of the developed first resist film before the step (2b). It is preferable that the double patterning method further include the step (3). When the double patterning method further includes the step (3), it is considered that the surface of the developed first resist film interacts with the basic compound, so that a resist pattern can be formed that shows a small difference in pattern height, has an excellent cross-sectional shape, and has both a narrow area and a wide area.

It suffices that the step (3) be performed before the step (2b). For example, any of the following configurations (3A) to (3C) may be employed.

(3A) The first developer includes an organic solvent and the basic compound, and the step (3) is performed in the step (1c). Specifically, the basic compound is brought into contact with the surface of the developed first resist film obtained by the step (1c) by utilizing a developer that includes an organic solvent and the basic compound as the first developer in the double patterning method (A).

(3B) The forming of the first resist pattern includes (1c') rinsing the developed first resist film with a rinsing agent after the step (1c), the rinsing agent includes the basic compound, and the step (3) is performed in the step (1c'). Specifically, the basic compound is brought into contact with the surface of the developed first resist film obtained by the step (1c) by rinsing the developed first resist film with the rinsing agent that includes the basic compound after the step (1c) in the double patterning method (A).

(3C) The second photoresist composition includes the basic compound, and the step (3) is performed in the step (2a). Specifically, the basic compound is brought into contact with the surface of the developed first resist film by utilizing the second photoresist composition that includes the basic compound in the step (2a).

Examples of the basic compound include nitrogen atom-containing compounds, compounds that include an anion having basicity, and the like.

Examples of the nitrogen atom-containing compounds include amine compounds, amide group-containing compounds, urea compounds, nitrogen-containing heterocyclic compounds, and the like.

Examples of the anion having basicity include a hydroxyl anion, a carboxylate anion, a sulfonate anion, a sulfonamide anion, and the like.

Specific examples of the basic compound include compounds mentioned later in connection with the acid diffusion controller [E] included in the photoresist composition, and the like.

It is preferable that the basic compound have higher basicity as compared with the conjugate base of the acidic group produced by dissociation of the acid-labile group included in the polymer [A]. When the basic compound has higher basicity as compared with the conjugate base of the acidic group, it is considered that the surface of the developed first resist film more strongly interacts with the basic compound, and the difference in height of the double pattern can be reduced while improving the cross-sectional shape and the width of the double pattern. For example, when the acidic group is a —COOH group, the conjugate base of the acidic group is a —COO-E$^+$ group (wherein E$^+$ is a counter anion). The basicity of the basic compound and the conjugate base of the acidic group is indicated by the base dissociation constant or the like.

Examples of the basic compound having higher basicity as compared with the conjugate base of the acidic group when the acidic group is a carboxyl group include amine compounds, nitrogen-containing heterocyclic compounds, compounds that include a hydroxyl anion, compounds that include a carboxylate anion, compounds that include a sulfonamide anion, and the like. Among these, amine compounds, nitrogen-containing heterocyclic compounds, compounds that include a carboxylate anion, and compounds that include a sulfonamide anion are preferable, tertiary amines and compounds that include a cyclic amino group are more preferable, trialkylamines, compounds that include a piperidine ring, and onium salts that include a sulfonamide anion are still more preferable, and 1,2,2,6,6-pentamethylpiperidin-4-ol and triphenylsulfonium N-n-butylsulfonamide are particularly preferable.

The content of the basic compound in the first developer is preferably 0.001 to 10 mass %, more preferably 0.01 to 8 mass %, still more preferably 0.1 to 5 mass %, and particularly preferably 0.3 to 3 mass %.

The content of the basic compound in the rinsing agent is preferably 0.001 to 10 mass %, more preferably 0.01 to 8 mass %, still more preferably 0.1 to 5 mass %, and particularly preferably 0.3 to 3 mass %.

The content of the basic compound in the second photoresist composition is preferably 0.01 to 30 parts by mass, more preferably 0.05 to 15 parts by mass, still more preferably 0.1 to 10 parts by mass, and particularly preferably 0.2 to 5 parts by mass, based on 100 parts by mass of the polymer included in the second photoresist composition.

When the content of the basic compound is within the above range, the difference in height of the double pattern formed by the double patterning method can be further reduced while improving the remaining properties.

Photoresist Composition

The first photoresist composition and the second photoresist composition used for the double patterning methods according to the embodiments of the invention are not particularly limited as long as the resist film formed using each photoresist composition shows a change in solubility in a developer upon exposure. Examples of the first photoresist composition and the second photoresist composition include a composition that shows a decrease in solubility in a developer that includes an organic solvent, and an increase in solubility in an alkaline developer upon exposure, and the like. For example, the resist film shows a change in solubility in a developer upon exposure when the photoresist composition includes a polymer that changes in polarity upon exposure.

It is preferable that the photoresist composition include the polymer [A], the acid generator [B], and the solvent [C]. The photoresist composition may preferably include [D] a polymer that has a fluorine atom content higher than that of the polymer [A] (hereinafter may be referred to as "polymer [D]"), [E] an acid diffusion controller, [F] an additive, and the like. Each component is described in detail below.

Polymer [A]

The acid-labile group that is included in the polymer [A] and dissociates by an action of an acid to produce an acidic group refers to a group that substitutes the hydrogen atom of an acidic group (e.g., carboxyl group or hydroxyl group), and dissociates by an action of an acid generated by the acid generator [B] upon exposure, for example. The polymer [A] that includes the acid-labile group shows a decrease in solubility in a developer that includes an organic solvent and an increase in solubility in an alkaline developer due to an increase in polarity when the acid-labile group dissociates in the exposed area to form an acidic group. Therefore, a negative-tone resist pattern is obtained by the above pattern-forming method. It is preferable that the polymer [A] include a structural unit (I) that includes an acid-labile group. The polymer [A] may include a structural unit (II) that includes a lactone-containing group or a cyclic carbonate-containing group, and a structural unit (III) that includes a hydrophilic functional group. Note that the polymer [A] may include two or more types of each structural unit. Each structural unit is described in detail below.

Structural Unit (I)

The structural unit (I) is represented by the following formula (1).

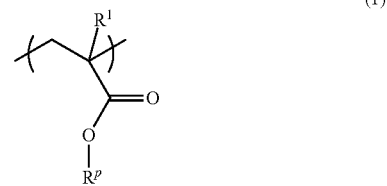

wherein R$^1$ is a hydrogen atom, a fluorine atom, a methyl group, or a trifluoromethyl group, and R$^p$ is an acid-labile group.

The acid-labile group represented by R$^p$ is preferably a group represented by the following formula (i).

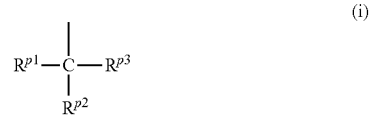

wherein R$^{p1}$, R$^{p2}$, and R$^{p3}$ are independently an alkyl group having 1 to 4 carbon atoms or a monovalent alicyclic hydrocarbon group having 4 to 20 carbon atoms, provided that R$^{p2}$ and R$^{p3}$ may bond to each other to form a divalent alicyclic hydrocarbon group having 4 to 20 carbon atoms together with the carbon atom bonded to R$^{p2}$ and R$^{p3}$.

Examples of the alkyl group having 1 to 4 carbon atoms represented by R$^{p1}$, R$^{p2}$, and R$^{p3}$ include a methyl group, an ethyl group, an n-propyl group, an i-propyl group, an n-butyl group, a 2-methylpropyl group, a 1-methylpropyl group, a t-butyl group, and the like.

Examples of the monovalent alicyclic hydrocarbon group having 4 to 20 carbon atoms represented by $R^{p1}$, $R^{p2}$, and $R^{p3}$ include polyalicyclic groups having a bridged skeleton (e.g., adamantane skeleton or norbornane skeleton), monoalicyclic groups having a cycloalkane skeleton (e.g., cyclopentane skeleton or cyclohexane skeleton), and the like. These groups may be substituted with one or more linear, branched, or cyclic alkyl groups having 1 to 10 carbon atoms, for example.

It is preferable that $R^{p1}$ be an alkyl group having 1 to 4 carbon atoms, and $R^{p2}$ and $R^{p3}$ bond to each other to form a divalent group having an adamantane skeleton or a cycloalkane skeleton together with the carbon atom bonded to $R^{p2}$ and $R^{p3}$.

Examples of the structural unit (I) include structural units represented by the following formulas (1-1) to (1-4), and the like.

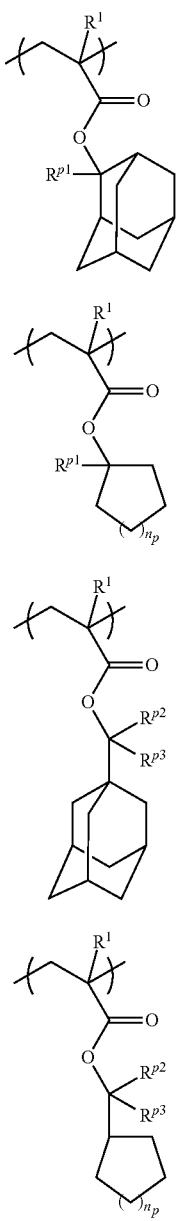

(1-1)

(1-2)

(1-3)

(1-4)

wherein $R^1$ is the same as defined for the formula (1), $R^{p1}$, $R^{p2}$, and $R^{p3}$ are the same as defined for the formula (i), and $n_p$ is an integer from 1 to 4.

Specific examples of the structural units represented by the formulas (1) and (1-1) to (1-4) include structural units represented by the following formulas, and the like.

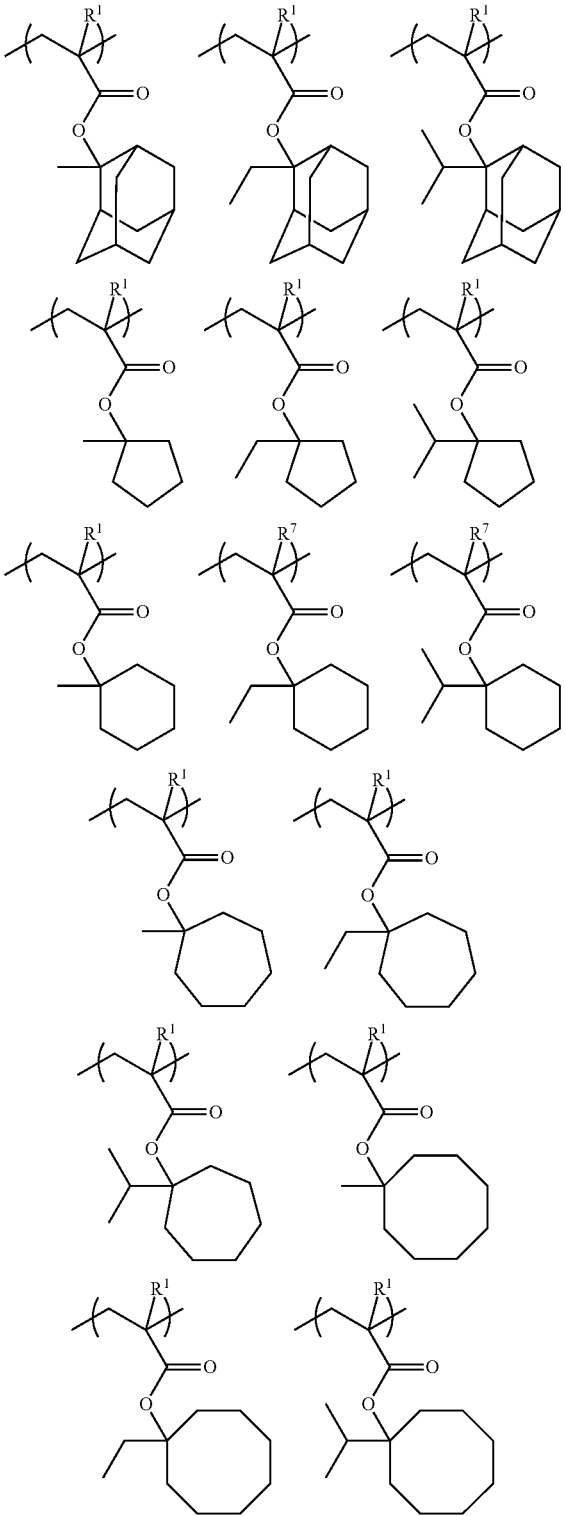

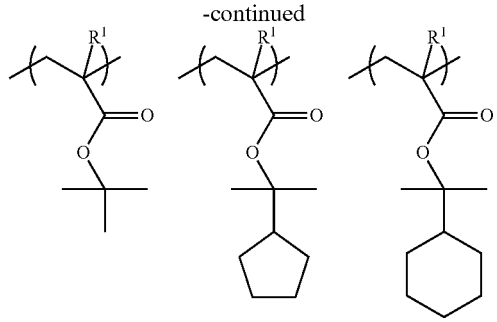

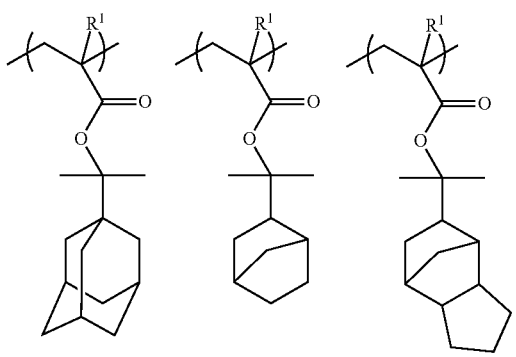

wherein $R^1$ is the same as defined for the formula (1).

Examples of a monomer that produces the structural unit (I) include 2-methyladamant-2-yl (meth)acrylate, 2-ethyladamant-2-yl (meth)acrylate, 2-methylbicyclo[2.2.1]hept-2-yl (meth)acrylate, 2-ethylbicyclo[2.2.1]hept-2-yl (meth)acrylate, 1-(bicyclo[2.2.1]hept-2-yl)-1-methylethyl (meth)acrylate, 1-(adamantan-1-yl)-1-methylethyl (meth)acrylate, 1-methyl-1-cyclopentyl (meth)acrylate, 1-ethyl-1-cyclopentyl (meth)acrylate, 1-methyl-1-cyclohexyl (meth)acrylate, 1-ethyl-1-cyclohexyl (meth)acrylate, and the like.

The content of the structural unit (I) in the polymer [A] is preferably 30 to 70 mol % based on the total structural units included in the polymer [A]. When the content of the structural unit (I) is within the above range, the photoresist composition exhibits improved lithographic performance, and a double pattern having an excellent shape can be obtained.

Structural Unit (II)

The polymer [A] preferably includes the structural unit (II) that includes a lactone-containing group or a cyclic carbonate-containing group. When the polymer [A] includes the structural unit (II), the resulting resist pattern exhibits improved adhesion to the substrate and improved inter-adhesion. The term "lactone-containing group" used herein refers to a group that includes one ring (lactone ring) that includes a structure represented by —O—C(O)—. The term "cyclic carbonate-containing group" used herein refers to a cyclic group that includes one ring (cyclic carbonate ring) that includes a bond represented by —O—C(O)—O—. A group that includes only one lactone ring or cyclic carbonate ring is referred to as a monocyclic group, and a group that further includes another cyclic structure is referred to as a polycyclic group.

Examples of the structural unit (II) include structural units represented by the following formulas, and the like.

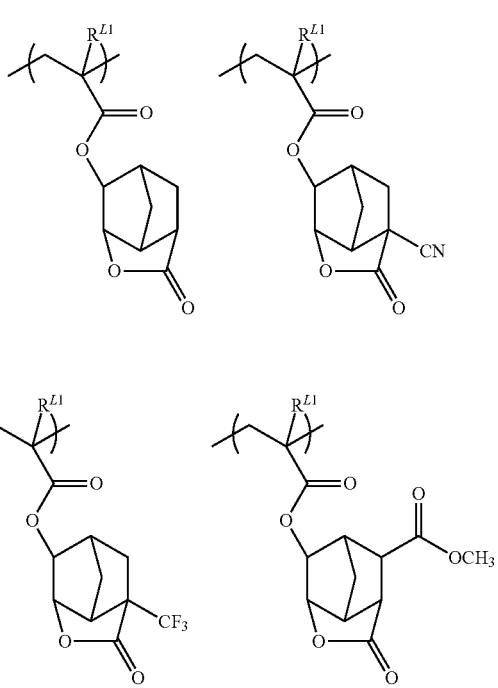

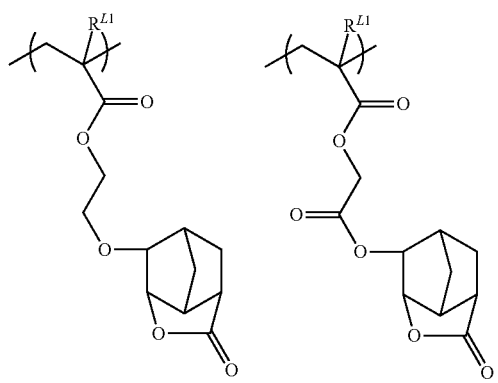

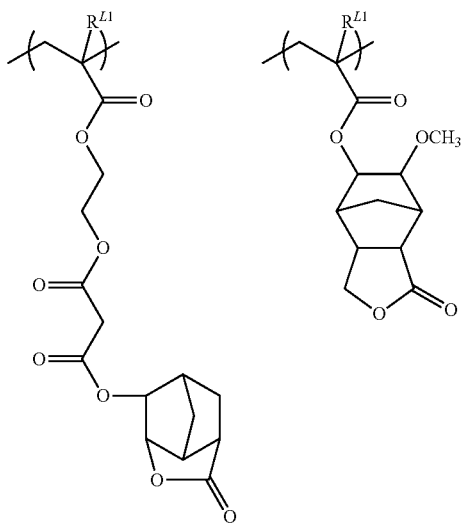

-continued

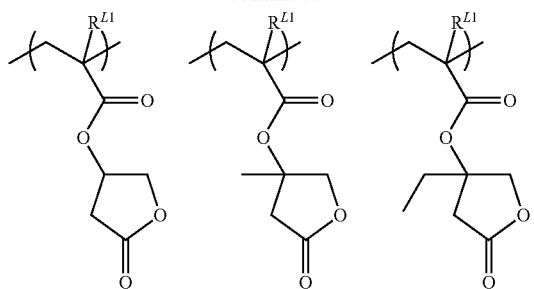

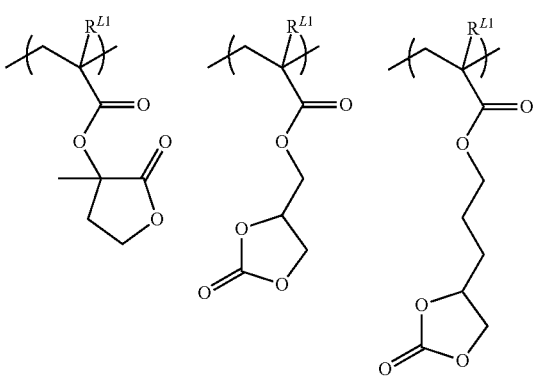

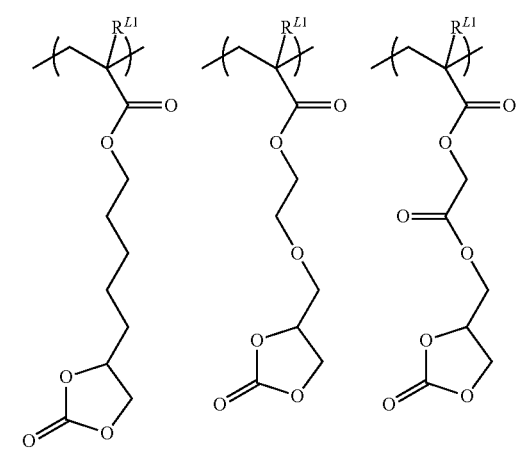

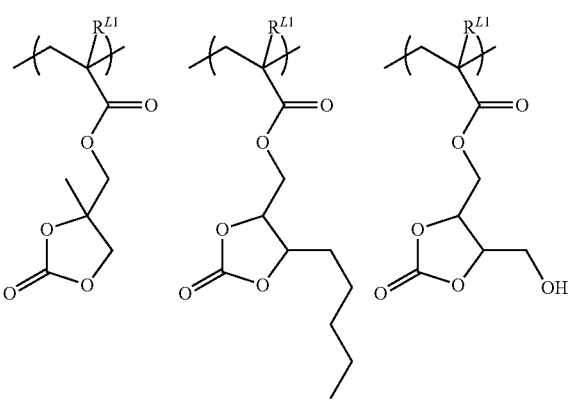

-continued

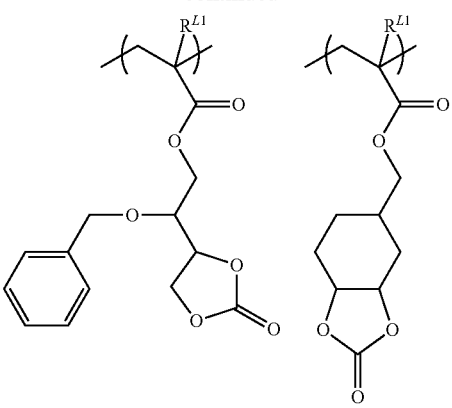

wherein $R^{L1}$ is a hydrogen atom, a fluorine atom, a methyl group, or a trifluoromethyl group.

Examples of a monomer that produces the structural unit (II) include a monomer represented by the following formula (L-1), and the like.

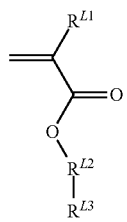

(L-1)

wherein $R^{L1}$ is a hydrogen atom, a fluorine atom, a methyl group, or a trifluoromethyl group, $R^{L2}$ is a single bond or a divalent linking group, and $R^{L3}$ is a monovalent organic group having a lactone structure or a cyclic carbonate structure.

Examples of the divalent linking group represented by $R^{L2}$ include divalent linear or branched hydrocarbon groups having 1 to 20 carbon atoms, and the like.

Examples of the monovalent organic group having a lactone structure represented by $R^{L3}$ include groups represented by the following formulas (L3-1) to (L3-6), and the like. Examples of the monovalent organic group having a cyclic carbonate structure include groups represented by the following formulas (L3-7) and (L3-8), and the like.

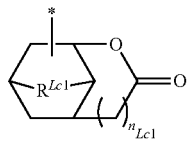

(L3-1)

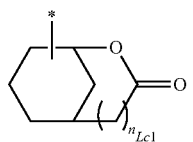

(L3-2)

-continued (L3-3)
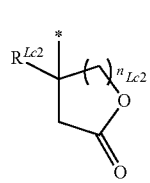

(L3-4)
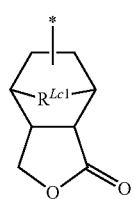

(L3-5)
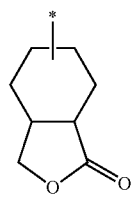

(L3-6)
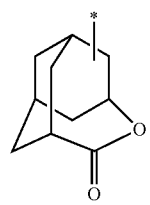

(L3-7)
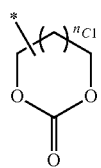

(L3-8)
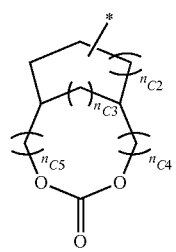

wherein $R^{Lc1}$ is an oxygen atom or a methylene group, $R^{Lc2}$ is a hydrogen atom or an alkyl group having 1 to 4 carbon atoms, $n_{Lc1}$ is 0 or 1, $n_{Lc2}$ is an integer from 0 to 3, $n_{C1}$ is an integer from 0 to 2, $n_{C2}$ to $n_{C5}$ are independently an integer from 0 to 2, and "*" is a site bonded to $R^{L2}$ in the formula (L-1). Note that the groups represented by the formulas (L3-1) to (L3-8) may be substituted with a substituent.

The content of the structural unit (II) in the polymer [A] is preferably 30 to 60 mol % based on the total structural units included in the polymer [A]. When the content of the structural unit (II) is within the above range, the resulting resist pattern exhibits improved adhesion to the substrate and improved inter-adhesion, and the strength of the resulting double pattern can be improved.

Structural Unit (III)

The polymer [A] may include the structural unit (III) that includes a hydrophilic functional group. When the polymer [A] includes the structural unit (III), the first resist pattern and the second resist pattern exhibit improved resistance to a developer that includes an organic solvent. As a result, a double pattern having an excellent shape can be obtained. Examples of the hydrophilic functional group include a hydroxyl group, an amino group, a ketonic carbonyl group, a sulfonamide group, and the like.

Examples of the structural unit (III) include structural units represented by the following formulas, and the like.

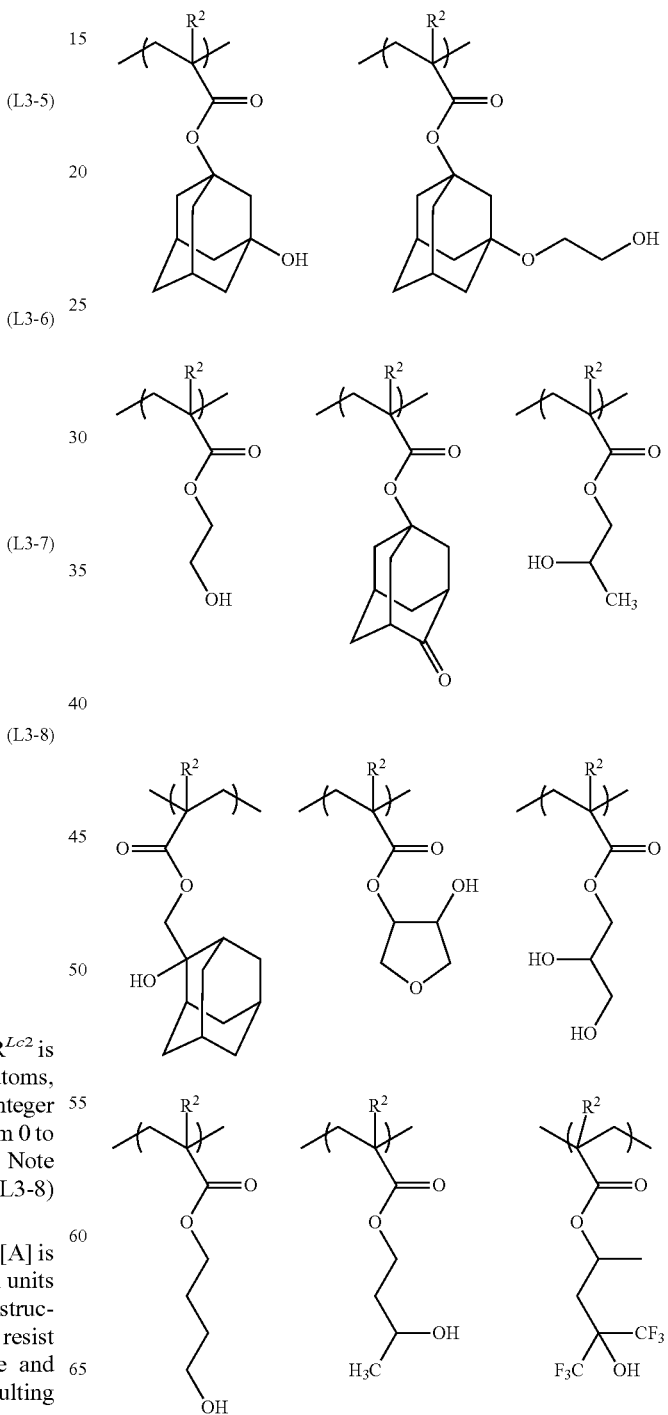

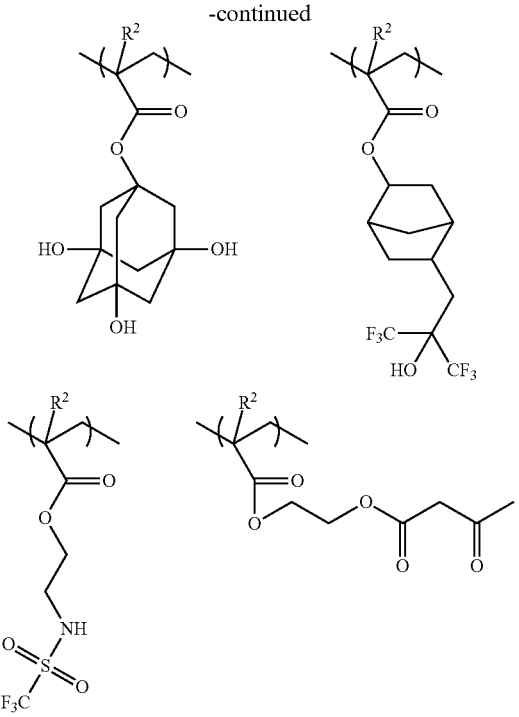

wherein R² is a hydrogen atom, a fluorine atom, a methyl group, or a trifluoromethyl group.

The content of the structural unit (III) in the polymer [A] is normally 30 mol % or less, and preferably 0 to 20 mol %, based on the total structural units included in the polymer [A].

The polymer [A] may include an additional structural unit other than the structural units (I) to (III). Examples of the additional structural unit include a structural unit that includes a polar group (e.g., cyano group), and the like. Examples of a monomer that produces the structural unit that includes a cyano group include 2-cyanomethyladamantyl (meth)acrylate, 2-cyanoethyl (meth)acrylate, and the like.

The content of the additional structural unit in the polymer [A] is normally 30 mol % or less, and preferably 0 to 20 mol %, based on the total structural units included in the polymer [A].

Synthesis of Polymer [A]

The polymer [A] may be synthesized by polymerizing a monomer that produces each structural unit in an appropriate solvent in the presence of a radical initiator, for example.

Examples of the radical initiator include azo-based radical initiators such as azobisisobutyronitrile (AIBN), 2,2'-azobis (4-methoxy-2,4-dimethylvaleronitrile), 2,2'-azobis(2-cyclopropylpropionitrile), 2,2'-azobis(2,4-dimethylvaleronitrile), and dimethyl 2,2'-azobisisobutyrate; peroxide-based radical initiators such as benzoyl peroxide, t-butyl hydroperoxide, and cumene hydroperoxide; and the like. Among these, AIBN and dimethyl 2,2'-azobisisobutyrate are preferable. These radical initiators may be used in combination.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, methyl ethyl ketone, 4-methyl-2-pentanone, and 2-heptanone; ethers such as tetrahydrofuran, dimethoxyethane, and diethoxyethane; alcohols such as methanol, ethanol, 1-propanol, 2-propanol, and 4-methyl-2-pentanol; and the like. These solvents may be used either alone or in combination.

The polymerization temperature is normally 40 to 150° C., and preferably 50 to 120° C. The polymerization time is normally 1 to 48 hours, and preferably 1 to 24 hours.

The weight average molecular weight (Mw) of the polymer [A] determined by gel permeation chromatography (GPC) is preferably 1000 to 100,000, more preferably 1000 to 50,000, and particularly preferably 1000 to 30,000. When the Mw of the polymer [A] is within the above range, a double pattern having an excellent cross-sectional shape can be formed. It is also possible to improve dry etching resistance.

The ratio (dispersity) (Mw/Mn) of the Mw to the number average molecular weight (Mn) of the polymer [A] is normally 1 to 3, and preferably 1 to 2.

The Mw and the Mn of the polymer are measured by GPC using GPC columns manufactured by Tosoh Corporation (G2000HXL×2, G3000HXL×1, G4000HXL×1) under the following conditions.

Eluant: tetrahydrofuran (manufactured by Wako Pure Chemical Industries, Ltd.)
Flow rate: 1.0 ml/min
Sample concentration: 1.0 mass %
Sample injection amount: 100 μl
Detector: differential refractometer
Standard: monodisperse polystyrene Acid Generator [B]

The acid generator [B] generates an acid upon exposure. The acid-labile group included in the polymer [A] dissociates due to the acid generated by the acid generator [B], and the solubility of the polymer [A] in the developer changes. The acid generator [B] may be included in the photoresist composition as a low-molecular-weight compound (described below) and/or included in the polymer as an acid-generating group.

Examples of the acid generator [B] include onium salt compounds, N-sulfonyloxyimide compounds, and the like.

Examples of the onium salt compounds include sulfonium salts, tetrahydrothiophenium salts, iodonium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, triphenylsulfonium 2-(1-adamantyl)-1,1-difluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxy)hexane-1-sulfonate, triphenylsulfonium 2-(1-adamantyl)-1,1-difluoroethanesulfonate, and the like.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl) tetrahydrothiophenium 2-bicyclo[2.2.1]hept-2-yl-1,1,2,2-tetrafluoroethanesulfonate, 1-(4-n-butoxynaphthalen-1-yl) tetrahydrothiophenium camphorsulfonate, 1-(6-n-butoxynaphthalen-2-yl)tetrahydrothiophenium trifluoromethanesulfonate, 1-(6-n-butoxynaphthalen-2-yl) tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl) tetrahydrothiophenium 2-bicyclo[2.2.1]hept-2-yl-1,1,2,2-tetrafluoroethanesulfonate, 1-(6-n-butoxynaphthalen2-yl) tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium2-bicyclo[2.2.1]hept-2-yl-1, 1,2,2-tetrafluoroethanesulfonate, 1-(3,5-dimethyl-4-hydroxyphenyl)tetrahydrothiophenium camphorsulfonate, and the like.

Examples of the iodonium salts include diphenyliodonium trifluoromethanesulfonate, diphenyliodonium nona fluoro-n-butanesulfonate, diphenyliodonium perfluoro-n-octanesulfonate, diphenyliodonium 2-bicyclo[2.2.1]hept-2-yl-1,1, 2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like.

Examples of the N-sulfonyloxyimide compounds include N-(trifluoromethanesulfonyloxy)bicyclo[2.2.1]hept-5-ene-2,3-dicarboxylmide, N-(nonafluoro-n-butanesulfonyloxy) bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1] hept-5-ene-2,3-dicarboxylmide, N-(2-(3-tetracyclo[4.4.0.1$^{2,5}$. 1$^{7,10}$] dodecanyl)-1,1-difluoroethanesulfonyloxy)bicyclo[2.2.1] hept-5-ene-2,3-dicarboxylmide, N-(camphorsulfonyloxy) bicyclo[2.2.1]hept-5-ene-2,3-dicarboxylmide, and the like.

Among these, onium salt compounds are preferable, sulfonium salts are more preferable, and triphenylsulfonium 2-bicyclo[2.2.1]hept-2-yl-1,1-difluoroethanesulfonate and triphenylsulfonium 2-(1-adamantyl)-1,1-difluoroethanesulfonate are particularly preferable. These acid generators [B] may be used in combination.

The acid generator [B] is normally used in an amount of 0.1 to 20 parts by mass, and preferably 0.5 to 15 parts by mass, based on 100 parts by mass of the polymer [A] in order to ensure that the resulting photoresist composition exhibits sufficient sensitivity and developability. If the amount of the acid generator [B] is less than 0.1 parts by mass, the sensitivity and the developability of the photoresist composition may deteriorate. If the amount of the acid generator [B] exceeds 20 parts by mass, it may be difficult to obtain the desired resist pattern due to a decrease in transparency to exposure light.

Solvent [C]

The solvent [C] is not particularly limited as long as the polymer [A], the acid generator [B], and an optional preferable component can be dissolved therein. Examples of the solvent [C] include alcohol-based solvents, ether-based solvents, ketone-based solvents, amide-based solvents, ester-based solvents, a mixture thereof, and the like.

For example, the solvents mentioned above in connection with the organic solvent that may be included in the first developer (i.e., the developer used in the step (1c)) may be used as the solvent [C]. The solvent [C] is preferably a ketone-based solvent or an ester-based solvent, more preferably an aliphatic ketone-based solvent, a polyhydric alcohol monoether acetate-based solvent, or a lactone-based solvent, and particularly preferably propylene glycol monomethyl ether acetate or γ-butyrolactone.

It is preferable that the solvent [C] included in the second photoresist composition be a solvent in which the first resist pattern is insoluble or scarcely soluble. When the first resist pattern is insoluble or scarcely soluble in the second photoresist composition, it is possible to form a resist pattern that shows a small difference in pattern height, has an excellent cross-sectional shape, and has both a narrow area and a wide area.

Polymer [D]

The polymer [D] is a polymer that has a fluorine atom content higher than that of the polymer [A]. When the photoresist composition includes the polymer [D], the polymer [D] tends to be unevenly distributed in the surface layer of the resist film due to the oil repellency of the polymer [D]. This makes it possible to suppress elution of the acid generator, the acid diffusion controller, and the like into the immersion medium during liquid immersion lithography. It is also possible to control the advancing contact angle of the resist film with the immersion medium within the desired range due to the water repellency of the polymer [D], and suppress occurrence of bubble defects. Moreover, since the receding contact angle of the resist film with the immersion medium increases (i.e., water droplets do not remain), it is possible to implement high-speed scan exposure. The fluorine atom content (mass %) may be calculated by determining the structure of the polymer by $^{13}$C-NMR, $^{1}$H-NMR, IR spectroscopy, or the like.

The polymer [D] is not particularly limited as long as the polymer [D] has a fluorine atom content higher than that of the polymer [A]. It is preferable that the polymer [D] include a fluoroalkyl group. The polymer [D] is produced by polymerizing one or more fluorine atom-containing monomers. Examples of the fluorine atom-containing monomers include monomers that include a fluorine atom in the main chain, monomers that include a fluorine atom in the side chain, and monomers that include a fluorine atom in the main chain and the side chain.

Examples of the monomers that include a fluorine atom in the main chain include α-fluoroacrylate compounds, α-trifluoromethyl acrylate compound, β-fluoroacrylate compounds, β-trifluoromethyl acrylate compounds, α,β-fluoroacrylate compounds, α,β-trifluoromethyl acrylate compounds, compounds in which the hydrogen atom of one or more vinyl sites is substituted with a fluorine atom, a trifluoromethyl group, or the like, and the like.

Examples of the monomers that include a fluorine atom in the side chain include compounds obtained by substituting the side chain of an alicyclic olefin compound (e.g., norbornene) with a fluorine atom, a fluoroalkyl group, or a group derived therefrom, fluoroalkyl acrylates, fluoroalkyl methacrylates, derivatives thereof, compounds obtained by substituting the side chain (i.e., a site that does not include a double bond) of an olefin with a fluorine atom, a fluoroalkyl group, or a group derived therefrom, and the like.

Examples of the monomers that include a fluorine atom in the main chain and the side chain include ester compounds that include a fluoroalkyl group or a group derived therefrom such as α-fluoroacrylates, β-fluoroacrylates, α,β-fluoroacrylates, α-trifluoromethylacrylates, α-trifluoromethylacrylates, and α,β-trifluoromethylacrylates, compounds obtained by substituting the side chain of a compound in which the hydrogen atom of one or more vinyl sites is substituted with a fluorine atom, a trifluoromethyl group, or the like, with a fluorine atom, a fluoroalkyl group, or a group derived therefrom, compounds obtained by substituting the hydrogen atom bonded to the double bond of an alicyclic olefin compound with a fluorine atom, a trifluoromethyl group, or the like, and substituting the side chain of the alicyclic olefin compound with a fluoroalkyl group or a group derived therefrom, and the like. Note that the term "alicyclic olefin compound" used herein refers to a compound that includes a double bond in its ring structure.

It is preferable that the polymer [D] include a structural unit (IV) represented by the following formula (F1).

wherein $R^3$ is a hydrogen atom, a fluorine atom, a methyl group, or a trifluoromethyl group, $R^4$ is a linear or branched alkyl group having 1 to 6 carbon atoms that includes at least one fluorine atom, a monovalent alicyclic hydrocarbon group having 4 to 20 carbon atoms that includes at least one fluorine atom, or a derivative thereof, k is an integer from 1 to 3, provided that a plurality of $R^4$ are either identical or different when a plurality of $R^4$ are present. and A is a single bond or a (k+1)-valent linking group.

Examples of the (k+1)-valent linking group represented by A include an oxygen atom, a sulfur atom, a carbonyloxy group, an oxycarbonyl group, an amide group, a sulfonylamide group, a urethane group, carbonyloxydi(oxycarbonyl)ethanediyl group, a carbonyloxydi(oxycarbonyl)propanediyl group, a tri(carbonyloxy)ethanediyl group, a carbonyloxytri(oxycarbonyl)ethanediyl group, a carbonyloxytri(oxycarbonyl)propanediyl group, a tetra(carbonyloxy)ethanediyl group, and the like.

Examples of a preferable monomer that produces the structural unit (IV) include trifluoromethyl (meth)acrylate, 2,2,2-trifluoroethyl (meth)acrylate, perfluoroethyl (meth)acrylate, perfluoro-n-propyl (meth)acrylate, perfluoro-1-propyl (meth)acrylate, perfluoro-n-butyl (meth)acrylate, perfluoro-1-butyl (meth)acrylate, perfluoro-t-butyl (meth)acrylate, 2-(1,1,1,3,3,3-hexafluoropropyl) (meth)acrylate, 1-(2,2,3,3,4,4,5,5-octafluoropentyl) (meth)acrylate, perfluorocyclohexylmethyl (meth)acrylate, 1-(2,2,3,3,3-pentafluoropropyl) (meth)acrylate, 1-(3,3,4,4,5,5,6,6,7,7,8,8,9,9,10,10,10-heptadecafluorodecyl) (meth)acrylate, 1-(5-trifluoromethyl-3,3,4,4,5,6,6,6-octafluorohexyl) (meth)acrylate, 2,2-di(2,2,2-trifluoroethyloxycarbonyl)ethyl (meth)acrylate, and 2,2-di(2,2,2-trifluoroethyloxycarbonyl)ethyl (meth)acrylate. Among these, 2,2,2-trifluoroethyl (meth)acrylate and 2,2-di(2,2,2-trifluoroethyloxycarbonyl)ethyl (meth)acrylate are more preferable.

The polymer [D] may include two or more types of the structural unit (IV). The content of the structural unit (IV) in the polymer [D] is normally 5 mol % or more, preferably 10 mol % or more, and more preferably 15 mol % or more, based on the total structural units included in the polymer [D]. If the content of the structural unit (IV) is less than 5 mol %, a receding contact angle of 70° or more may not be obtained, or elution of the acid generator and the like from the resist film may not be suppressed.

The polymer [D] may further include one or more additional structural units such as the structural unit (I) that includes an acid-labile group, the structural unit (II) that includes a lactone-containing group or a cyclic carbonate-containing group, and a structural unit that includes an alicyclic group, in order to control the dissolution rate of the polymer [D] in the developer.

Examples of the structural unit that includes an alicyclic group include a structural unit represented by the following formula (F2), and the like.

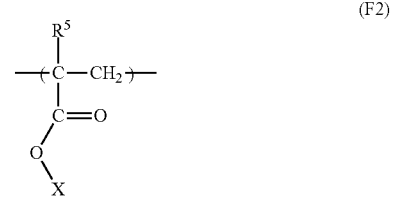

wherein $R^5$ is a hydrogen atom, a fluorine atom, a methyl group, or a trifluoromethyl group, and X is a monovalent alicyclic hydrocarbon group having 4 to 20 carbon atoms.

Examples of the monovalent alicyclic hydrocarbon group having 4 to 20 carbon atoms represented by X include hydrocarbon groups that include an alicyclic ring derived from a cycloalkane such as cyclobutane, cyclopentane, cyclohexane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, or tricyclo[3.3.1.1$^{3,7}$]decane.

The content of the additional structural unit in the polymer [D] is normally 90 mol % or less, and more preferably 80 mol % or less, based on the total structural units included in the polymer [D].

The polymer [D] is preferably used in an amount of 0.1 to 20 parts by mass, and more preferably 1 to 10 parts by mass, based on 100 parts by mass of the polymer [A]. When the amount of the polymer [D] is within the above range, the pattern-forming capability of the photoresist composition can be further improved when using liquid immersion lithography. As a result, a double pattern having an excellent shape can be obtained.

Synthesis of Polymer [D]

The polymer [D] may be synthesized in the same manner as the polymer [A], for example. The Mw of the polymer [D] is preferably 1000 to 50,000, more preferably 1000 to 30,000, and particularly preferably 1000 to 10,000. If the Mw of the polymer [D] is less than 1000, a sufficient receding contact angle may not be obtained.

Acid Diffusion Controller [E]

The acid diffusion controller [E] controls a phenomenon in which the acid generated by the acid generator [B] upon exposure is diffused in the resist film, and suppresses undesired chemical reactions in the unexposed area. The acid diffusion controller [E] also improves the storage stability of the photoresist composition. The acid diffusion controller [E] may be included in the photoresist composition as a free compound, and/or may be included in the polymer included in the photoresist composition.

Examples of the acid diffusion controller [E] include amine compounds, amide group-containing compounds, urea compounds, nitrogen-containing heterocyclic compounds, and the like.

Examples of the amine compounds include mono(cyclo) alkylamines, di(cyclo)alkylamines, tri(cyclo)alkylamines, substituted-alkylaniline or derivatives thereof, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, and the like.

Examples of the amide group-containing compounds include N-t-butoxycarbonyl group-containing amino compounds such as N-(t-butoxycarbonyl)-4-hydroxypiperidine, N-t-pentyloxycarbonyl group-containing amino compounds such as N-(t-pentyloxycarbonyl)-4-hydroxypiperidine, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles, pyridines, piperazines, pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

A photodegradable base that generates a weak acid upon exposure may also be used as the acid diffusion controller [E]. Examples of the photodegradable base include onium salt compounds that lose acid-diffusion controllability upon decomposition due to exposure. Examples of the onium salt compounds include sulfonium salt compounds represented by the following formula (K1), iodonium salt compounds represented by the following formula (K2), and the like.

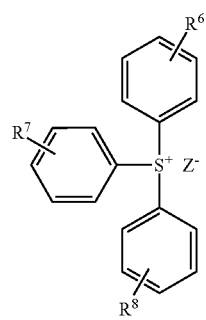
(K1)

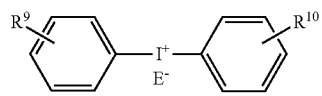
(K2)

wherein $R^6$ to $R^{10}$ are independently a hydrogen atom, an alkyl group, an alkoxy group, a hydroxyl group, or a halogen atom, $Z^-$ and $E^-$ are $OH^-$, $R^A$—$COO^-$, $R^A$—$SO_3^-$, $R^A$—$N^-$—$SO_2$—$R^B$, or an anion represented by the following formula (K3), $R^A$ is an alkyl group, an aryl group, or an alkaryl group, and $R^B$ is an alkyl group that is substituted with a fluorine atom, or unsubstituted.

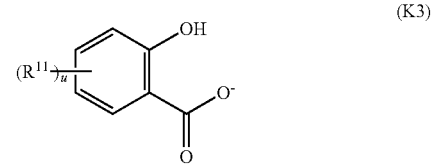
(K3)

wherein $R^{11}$ is a linear or branched alkyl group having 1 to 12 carbon atoms in which some or all of the hydrogen atoms may be substituted with a fluorine atom, or a linear or branched alkoxy group having 1 to 12 carbon atoms in which some or all of the hydrogen atoms may be substituted with a fluorine atom, and u is an integer from 0 to 2.

These acid diffusion controllers [E] may be used in combination. The acid diffusion controller [E] is preferably used in an amount of less than 5 parts by mass based on 100 parts by mass of the polymer [A]. If the amount of the acid diffusion controller [E] exceeds 5 parts by mass, the sensitivity of the resulting resist may deteriorate.

Additive [F]

The photoresist composition may include a surfactant, a sensitizer, or the like as the additive [F].

Surfactant

The surfactant improves the applicability, striation, developability, and the like of the photoresist composition. Examples of the surfactant include those normally used for a photoresist composition.

Sensitizer

The sensitizer increases the amount of acid generated by the acid generator [B], and improves the apparent sensitivity of the photoresist composition.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used in combination.

Preparation of Photoresist Composition

The photoresist composition may be prepared by mixing the polymer [A], the acid generator [B], the solvent [C], and an optional preferable component in a given ratio, for example. The solid content in the photoresist composition is normally 1 to 50 mass %, and preferably 1 to 25 mass %.

EXAMPLES

The invention is further described below by way of examples. Note that the invention is not limited to the following examples.

Synthesis of Polymers [A] and [D]

The following monomers were used to synthesize the polymers [A] and [D].

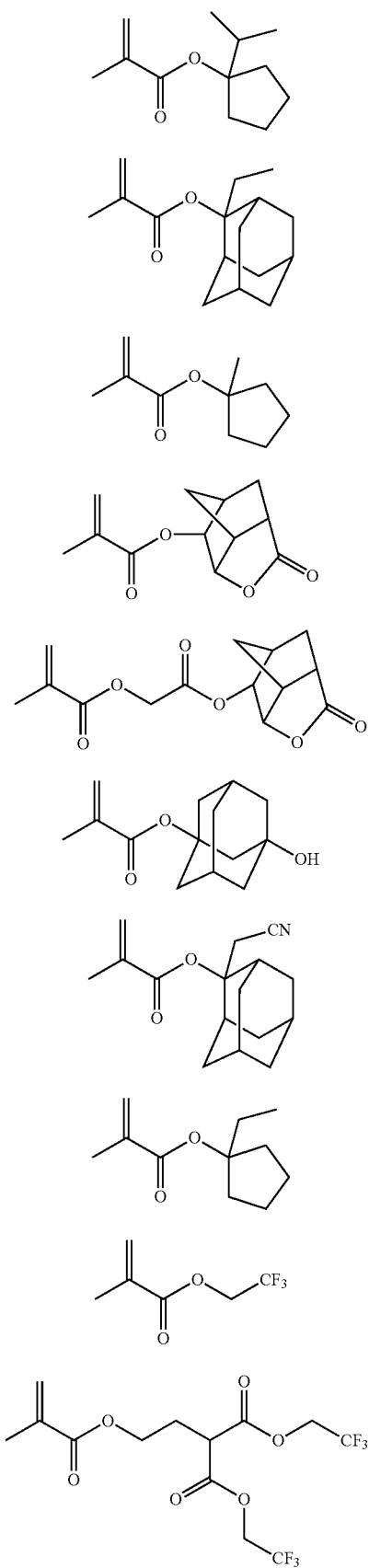

Synthesis Example 1

50 mol % of the compound (M-1), 50 mol % of the compound (M-4), and 2 mol % of AIBN (initiator) were dissolved in 60 g of methyl ethyl ketone to prepare a monomer solution. The total mass of the monomer compounds was 30 g. A 500 ml three-necked flask equipped with a thermometer and a dropping funnel was charged with 30 g of methyl ethyl ketone, and purged with nitrogen for 30 minutes. The flask was heated to 80° C. while stirring the inside of the flask using a magnetic stirrer. The monomer solution was then added dropwise to the flask over 3 hours using the dropping funnel. The monomers were polymerized for 6 hours from the start of dropwise addition of the monomer solution. The mixture was then cooled to 30° C. or less to obtain a polymer solution. The polymer solution was added to 600 g of methanol, and a white powder that had precipitated was filtered off. The white powder was washed twice with 120 g of methanol in a slurry state, filtered off, and dried at 50° C. for 17 hours to obtain a white powdery polymer (A-1) (23.5 g, yield: 78.3%). The ratio of the content (mol %) of structural units derived from the compound (M-1) to the content (mol %) of structural units derived from the compound (M-4) in the polymer (A-1) (determined by $^{13}$C-NMR analysis) was 47.8:52.2. The polymer (A-1) had an Mw of 11,800 and a dispersity (Mw/Mn) of 1.60. Note that the polymer was subjected to $^{13}$C-NMR analysis (solvent: DMSO-$d_6$) using a system "JNM-EX400" (manufactured by JEOL Ltd.).

Synthesis Examples 2 to 4

A polymer was synthesized in the same manner as in Synthesis Example 1, except that the type and the amount of each monomer were changed as shown in Table 1. The content of respective structural units in the polymer, the Mw, the dispersity (Mw/Mn), and the yield of the polymer are also shown in Table 1. Note that the symbol "-" in Table 1 indicates that the corresponding monomer was not used.

Synthesis Example 5

35.8 g (70 mol %) of the compound (M-8), 14.2 g (30 mol %) of the compound (M-9), and 3.2 g (8 mol %) of dimethyl 2,2'-azobisisobutyrate (initiator) were dissolved in 100 g of methyl ethyl ketone to prepare a monomer solution. A three-necked flask (500 ml) was charged with 100 g of methyl ethyl ketone, purged with nitrogen for 30 minutes, and heated to 80° C. with stirring. The monomer solution was added dropwise to the flask over 3 hours using a dropping funnel. The monomers were polymerized for 6 hours from the start of dropwise addition of the monomer solution. After completion of polymerization, the polymer solution was cooled to 30° C. or less, and washed with 825 g of a methanol/methyl ethyl ketone/hexane (=2/1/8 (mass ratio)) mixture. The solvent was then replaced with propylene glycol monomethyl ether acetate to obtain a solution including a polymer (D-1) (38.0 g (based on solid), yield: 76.0%). The ratio of the content (mol %) of structural units derived from the compound (M-8) to the content (mol %) of structural units derived from the compound (M-9) in the polymer (D-1) (determined by $^{13}$C-NMR analysis) was 70.2:29.8. The polymer (D-1) had an Mw of 7000 and a dispersity (Mw/Mn) of 1.40.

Synthesis Example 6

A solution including a polymer (D-2) was obtained in the same manner as in Synthesis Example 5, except that 27.3 g (70 mol %) of the compound (M-1) and 22.7 g (30 mol %) of the compound (M-10) were used as the monomer compounds (35.9 g (based on solid), yield: 71.7%). The ratio of the content (mol %) of structural units derived from the compound (M-1) to the content (mol %) of structural units derived from the compound (M-10) in the polymer (D-2) (determined by $^{13}$C-NMR analysis) was 67.9:32.1. The polymer (D-2) had an Mw of 6200 and a dispersity (Mw/Mn) of 1.52.

Acid Diffusion Controller [E]

E-1: N-(t-pentyloxycarbonyl)-4-hydroxypiperidine represented by the following formula (E-1)

E-2: triphenylsulfonium N-n-butyl-trifluoromethylsulfonamide represented by the following formula (E-2)

E-3: 1,2,2,6,6-pentamethylpiperidin-4-ol represented by the following formula (E-3)

TABLE 1

| | | Structural unit (I) | | | Structural unit (II) | | | Structural unit (III) or additional structural unit | | | | | |
|---|---|---|---|---|---|---|---|---|---|---|---|---|---|
| | Polymer | Type | Amount (mol %) | Structural unit content (mol %) | Type | Amount (mol %) | Structural unit content (mol %) | Type | Amount (mol %) | Structural unit content (mol %) | Amount (mol %) of initiator | Mw | Mw/Mn | Yield (%) |
| Synthesis Example 1 | A-1 | M-1 | 50 | 47.8 | M-4 | 50 | 52.2 | — | — | — | 2 | 11,800 | 1.60 | 78.3 |
| Synthesis Example 2 | A-2 | M-2 | 50 | 52.1 | M-5 | 50 | 47.9 | — | — | — | 5 | 6,600 | 1.41 | 76.8 |
| Synthesis Example 3 | A-3 | M-3 | 45 | 44.8 | M-4 | 40 | 41.2 | M-6 | 15 | 14.0 | 5 | 5,900 | 1.36 | 75.8 |
| Synthesis Example 4 | A-4 | M-1 | 45 | 47.3 | M-5 | 40 | 38.8 | M-7 | 15 | 13.9 | 2 | 12,100 | 1.67 | 69.4 |
| Synthesis Example 5 | D-1 | M-8 | 70 | 70.2 | — | — | — | M-9 | 30 | 29.8 | 8 | 7,000 | 1.40 | 76.0 |
| Synthesis Example 6 | D-2 | M-1 | 70 | 67.9 | — | — | — | M-10 | 30 | 32.1 | 8 | 6,200 | 1.52 | 71.7 |

Preparation of Photoresist Composition

The following components were used to prepare the photoresist composition.

Acid Generator [B]

B-1: triphenylsulfonium 2-(bicyclo[2.2.1]heptan-2-yl)-1,1-difluoroethanesulfonate represented by the following formula (B-1)

B-2: triphenylsulfonium 2-(1-adamantyl)-1,1-difluoroethanesulfonate represented by the following formula (B-2)

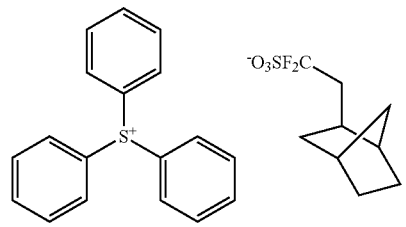

(B-1)

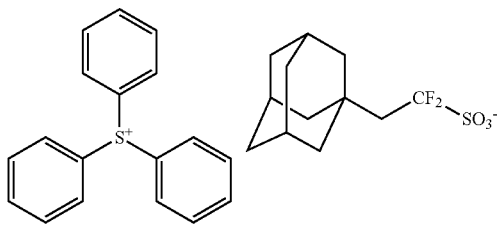

(B-2)

Solvent [C]

C-1: propylene glycol monomethyl ether acetate
C-2: cyclohexanone
C-3: γ-butyrolactone

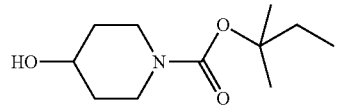

(E-1)

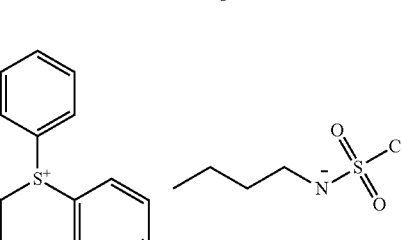

(E-2)

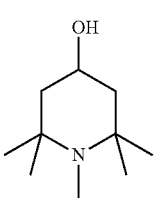

(E-3)

Preparation Example 1

100 parts by mass of the polymer (A-1) (polymer [A]), 7.8 parts by mass of the acid generator (B-1) (acid generator [B]), 3320 parts by mass of the solvent (C-1) (solvent [C]), 1420 parts by mass of the solvent (C-2) (solvent [C]), 30 parts by mass of the solvent (C-3) (solvent [C]), 3 parts by mass of the polymer (D-1) (polymer [D]), and 1.0 part by mass of the acid diffusion controller (E-1) (acid diffusion controller [E]) were mixed to prepare a photoresist composition (J-1).

Preparation Examples 2 to 6

A photoresist composition was prepared in the same manner as in Preparation Example 1, except that the type and the amount of each monomer were changed as shown in Table 2.

to PEB at 85° C. for 60 seconds on the hot plate of the coater/developer "Clean Track Lithius Pro-i", and cooled at 23° C. for 30 seconds. The resist film was then subjected to puddle development for 30 seconds using MAK as a developer, rinsed with MPL for 7 seconds, and spin-dried at 2000

TABLE 2

| | Photoresist composition | Polymer [A] | | Acid generator [B] | | Solvent [C] | | Polymer [D] | | Acid diffusion controller [E] | |
|---|---|---|---|---|---|---|---|---|---|---|---|
| | | Type | Amount (parts by mass) | Type | Amount (parts by mass) | Type | Amount (parts by mass) | Type | Amount (parts by mass) | Type | Amount (parts by mass) |
| Preparation Example 1 | J-1 | A-1 | 100 | B-1 | 7.8 | C-1/C-2/C-3 | 3320/1420/30 | D-1 | 3 | E-1 | 1.0 |
| Preparation Example 2 | J-2 | A-1 | 100 | B-2 | 8.0 | C-1/C-2/C-3 | 3350/1440/30 | D-1 | 3 | E-2 | 2.0 |
| Preparation Example 3 | J-3 | A-2 | 100 | B-2 | 8.0 | C-1/C-2/C-3 | 3320/1420/30 | D-2 | 3 | E-1 | 1.0 |
| Preparation Example 4 | J-4 | A-3 | 100 | B-1 | 7.8 | C-1/C-2/C-3 | 3350/1440/30 | D-2 | 3 | E-2 | 2.0 |
| Preparation Example 5 | J-5 | A-4 | 100 | B-1 | 7.8 | C-1/C-2/C-3 | 3350/1440/30 | D-1 | 3 | E-2 | 2.0 |
| Preparation Example 6 | J-6 | A-1 | 100 | B-2 | 7.8 | C-1/C-2/C-3 | 3350/1440/30 | D-1 | 3 | E-3 | 2.0 |

Formation of Double Pattern (Double Patterning)

Double Patterning Method (A)

Example 1

An antireflective film-forming material ("ARC66" manufactured by Nissan Chemical Industries, Ltd.) was spin-coated onto a 12-inch silicon wafer (substrate) using a coater/developer ("CLEAN TRACK Lithius Pro i" manufactured by Tokyo Electron Ltd.), and baked at 205° C. for 60 seconds to form an underlayer antireflective film (thickness: 105 nm). The photoresist composition (J-1) was spin-coated onto the substrate (on which the underlayer antireflective film was formed) using a coater/developer ("CLEAN TRACK ACT 12" manufactured by Tokyo Electron Ltd.), soft-baked (SB) at 80° C. for 60 seconds, and cooled at 23° C. for 30 seconds to form a resist film (thickness: 60 nm). The resist film was subjected to reduced projection exposure via a line-and-space pattern mask using an ArF immersion scanner ("NSR-S610C" manufactured by Nikon Precision Inc.) (NA: 1.3, Dipole X) so that a 28 nm line/112 nm pitch pattern was formed. The resist film was subjected to PEB at 85° C. for 60 seconds on the hot plate of the coater/developer "Clean Track Lithius Pro-i", and cooled at 23° C. for 30 seconds. The resist film was then developed for 30 seconds using methyl amyl ketone (MAK) as a developer, rinsed with 4-methyl-2-pentanol (MPL) (rinsing agent) for 7 seconds, and spin-dried at 2000 rpm for 15 seconds to form a 28 nm line/112 nm pitch first resist pattern.

The photoresist composition (J-1) was then spin-coated onto the first resist pattern using the coater/developer "CLEAN TRACK ACT 12", soft-baked (SB) at 80° C. for 60 seconds, and cooled at 23° C. for 30 seconds to form a resist film (thickness: 60 nm). The resist film was subjected to reduced projection exposure via a line-and-space pattern mask using the ArF immersion scanner "NSR-S610C" (NA: 1.3, Dipole X). Note that the resist film was exposed so that the lines of the first resist pattern and the lines of a 28 nm line/112 nm pitch second resist pattern (described below) were alternately disposed. The resist film was then subjected rpm for 15 seconds to form a 28 nm line/112 nm pitch second resist pattern. A 28 nm line/56 nm pitch double pattern was thus obtained.

Examples 2 to 17

A double pattern was formed in the same manner as in Example 1, except that the photoresist composition shown in Table 3 was used, and the conditions were changed as shown in Table 3. In Table 3, "BA" indicates butyl acetate, "ANS" indicates anisole, and "MAK+" indicates MAK that includes the compound represented by the formula (E-2) (1 mass %). The symbol "-" in Table 1 indicates that the corresponding component was not used.

Double Patterning Method (B)

Example 12

A resist film (thickness: 60 nm) was formed in the same manner as in Example 1 using the photoresist composition (J-1). The resist film was exposed using the ArF immersion scanner "NSR-S610C", subjected to PEB, and cooled under the same conditions as in Example 1. The resist film was then subjected to puddle development for 30 seconds using a 2.38 mass % tetramethylammonium hydroxide (TMAH) aqueous solution as a developer, rinsed with ultrapure water, and spin-dried at 2000 rpm for 15 seconds. The entire resist film was then exposed using the ArF immersion scanner "NSR-S610C" (NA: 1.3, Dipole X) at a dose of 20 mJ/cm$^2$ without using a mask. The resist film was then subjected to PEB at 85° C. for 60 seconds on the hot plate of the coater/developer "Clean Track Lithius Pro-i", and cooled at 23° C. for 30 seconds to form a 28 nm line/112 nm pitch first resist pattern. A second resist pattern was then formed in the same manner as in Example 1 to obtain a 28 nm line/56 nm pitch double pattern.

Example 13

A double pattern was obtained in the same manner as in Example 12, except that the first resist pattern and the second resist pattern were formed using the photoresist composition (J-2).

Comparative Example 1

A resist film (thickness: 60 nm) was formed in the same manner as in Example 12 using the photoresist composition (J-1). The resist film was exposed using the ArF immersion scanner "NSR-S610C", subjected to PEB, developed, and rinsed under the same conditions as in Example 12, except that the resist film was subjected to PEB at 105° C. The resist film was then spin-dried at 2000 rpm for 15 seconds. The pattern protective film material described in Example 88 of Japanese Patent Application Publication (KOKAI) No. 2009-69817 was spin-coated onto the resist film using the coater/developer "CLEAN TRACK ACT 12" so that a protective film having a thickness of 120 nm was formed, baked at 160° C. for 60 seconds, cooled at 23° C. for 30 seconds, subjected to puddle development for 30 seconds using a 2.38 mass % TMAH aqueous solution, rinsed with water (ultrapure water), and spin-dried at 2000 rpm for 15 seconds to remove unnecessary protective film, and baked at 160° C. for 60 seconds to crosslink the surface of the pattern to form a first resist pattern.

A second resist pattern was then formed in the same manner as in Example 1, except that a 2.38 mass % TMAH aqueous solution was used as the developer, and water (ultrapure water) was used as the rinsing agent, to obtain a 28 nm line/56 nm pitch double pattern.

Comparative Example 2

A double pattern was obtained in the same manner as in Comparative Example 1, except that the first resist pattern and the second resist pattern were formed using the photoresist composition (J-3).

Evaluation

The double patterns thus formed were evaluated as described below. The results are shown in Table 3.

Difference in Pattern Height (nm)

A dose at which a 28 nm line/112 nm pitch line-and-space pattern was formed using a 56 nm line/112 nm pitch mask pattern was determined to be an optimum dose. The cross-sectional shape of the line-and-space pattern formed at the optimum dose was observed using a scanning electron microscope ("S-4800" manufactured by Hitachi High-Technologies Corporation). The difference in height between the first resist pattern and the second resist pattern was measured, and taken as the difference in pattern height (nm). A case where the difference in pattern height was less than 20 nm was evaluated as "A" (acceptable), and a case where the difference in pattern height was 20 nm or more was evaluated as "B" (unacceptable).

Cross-Sectional Shape of Pattern

The cross-sectional shape of the line-and-space pattern formed at the optimum dose was observed using the scanning electron microscope. A case where the cross-sectional shape of the pattern was rectangular was evaluated as "A" (acceptable), and a case where the cross-sectional shape of the pattern was not rectangular (e.g., the cross-sectional shape of the pattern was angular, or spread toward the bottom) was evaluated as "B" (unacceptable).

Maximum Curing Dimension

A resist pattern used to evaluate the maximum curing dimension was prepared in the same manner as in Examples 1 to 17, except that exposure was not performed when forming the second resist pattern. A resist pattern used to evaluate the maximum curing dimension was prepared in the same manner as in Comparative Examples 1 and 2, except that the entire film was exposed at a dose of 20 mJ/cm$^2$ when forming the second resist pattern. Therefore, the photoresist composition applied to the first resist pattern is removed by the developer used for development when forming the second resist pattern. Note that the film was exposed when forming the first resist pattern at an optimum dose for forming a 42 nm line/84 nm pitch pattern. The resist pattern (pitch: 500 nm) used to evaluate the maximum curing dimension was prepared while changing the line width from 50 nm to 400 nm at intervals of 10 nm. The state of the first resist pattern after performing the second resist pattern-forming process was observed, and the line width of the pattern that was not damaged and having the maximum line width was taken as the maximum curing dimension. A double pattern having a wider area can be advantageously formed when the maximum curing dimension is larger. A case where the maximum curing dimension was 300 nm or more was evaluated as "A" (acceptable), and a case where the maximum curing dimension was less than 300 nm was evaluated as "B" (unacceptable).

TABLE 3

| | First resist pattern | | | | Second resist pattern | | | | Evaluation | | |
|---|---|---|---|---|---|---|---|---|---|---|---|
| | Photoresist composition | PEB temperature (° C.) | Developer | Rinsing agent | Photoresist composition | PEB temperature (° C.) | Developer | Rinsing agent | Difference in pattern height (nm) | Cross-sectional shape of pattern | Maximum curing dimension |
| Example 1 | J-1 | 85 | MAK | MPL | J-1 | 85 | MAK | MPL | 18 | A | A |
| Example 2 | J-1 | 85 | BA | MPL | J-1 | 85 | BA | MPL | 15 | A | A |
| Example 3 | J-1 | 85 | ANS | MPL | J-1 | 85 | ANS | MPL | 15 | A | A |
| Example 4 | J-2 | 85 | MAK | MPL | J-2 | 85 | MAK | MPL | 3 | A | A |
| Example 5 | J-2 | 85 | BA | MPL | J-2 | 85 | BA | MPL | 2 | A | A |
| Example 6 | J-2 | 85 | ANS | MPL | J-2 | 85 | ANS | MPL | 2 | A | A |
| Example 7 | J-3 | 85 | MAK | MPL | J-3 | 85 | MAK | MPL | 19 | A | A |
| Example 8 | J-3 | 85 | BA | MPL | J-3 | 85 | BA | MPL | 16 | A | A |
| Example 9 | J-4 | 105 | MAK | MPL | J-4 | 105 | MAK | MPL | 2 | A | A |
| Example 10 | J-4 | 105 | BA | MPL | J-4 | 105 | BA | MPL | 1 | A | A |
| Example 11 | J-5 | 85 | MAK | MPL | J-5 | 85 | MAK | MPL | 2 | A | A |
| Example 12 | J-1 | 85 | TMAH | Water | J-1 | 85 | MAK | MPL | 15 | A | A |
| Example 13 | J-2 | 85 | TMAH | Water | J-2 | 85 | MAK | MPL | 3 | A | A |
| Example 14 | J-6 | 85 | MAK | MPL | J-6 | 85 | MAK | MPL | 2 | A | A |
| Example 15 | J-6 | 85 | BA | MPL | J-6 | 85 | BA | MPL | 2 | A | A |
| Example 16 | J-6 | 85 | MAK+ | MPL | J-1 | 85 | MAK | MPL | 5 | A | A |
| Example 17 | J-6 | 85 | MAK+ | MPL | J-2 | 85 | MAK | MPL | 4 | A | A |

TABLE 3-continued

| | First resist pattern | | | | Second resist pattern | | | | Evaluation | | |
|---|---|---|---|---|---|---|---|---|---|---|---|
| | Photoresist composition | PEB temperature (° C.) | Developer | Rinsing agent | Photoresist composition | PEB temperature (° C.) | Developer | Rinsing agent | Difference in pattern height (nm) | Cross-sectional shape of pattern | Maximum curing dimension |
| Comparative Example 1 | J-1 | 105 | TMAH | Water | J-1 | 105 | TMAH | Water | 28 | B | B |
| Comparative Example 2 | J-3 | 105 | TMAH | Water | J-3 | 105 | TMAH | Water | 26 | B | B |

As is clear from the results shown in Table 3, it was confirmed that the double patterning method according to the embodiments of the invention could form the first resist pattern and the second resist pattern to have an almost equal height, and form a double pattern having an excellent shape (i.e., a rectangular cross-sectional shape). It was also confirmed that the double patterning method according to the embodiments of the invention could increase the maximum curing dimension of the resist pattern, and may suitably be used to form a resist pattern having both a narrow area and a wide area.

The embodiments of the invention thus provide a double patterning method that can form a resist pattern that shows a small difference in pattern height, has an excellent cross-sectional shape, and has both a narrow area and a wide area. Therefore, the double patterning method may suitably be used for microfabrication that utilizes lithography.

Obviously, numerous modifications and variations of the present invention are possible in light of the above teachings. It is therefore to be understood that within the scope of the appended claims, the invention may be practiced otherwise than as specifically described herein.

The invention claimed is:

1. A double patterning method comprising:
   providing a first resist film on a substrate using a first photoresist composition;
   exposing the first resist film;
   developing the exposed first resist film using a first developer to form a first resist pattern;
   providing a second resist film in at least space areas of the first resist pattern using a second photoresist composition;
   exposing the second resist film; and
   removing a light-unexposed area in the second resist film using a second developer that includes an organic solvent to form a second resist pattern, the light-unexposed area being not exposed and having a lower polarity than a light-exposed area which is exposed in the second resist film, the first resist pattern being insoluble or scarcely soluble in the second developer.

2. The double patterning method according to claim 1, wherein the first developer includes an organic solvent.

3. The double patterning method according to claim 1, wherein the first developer is an alkaline developer, and the first resist film is further exposed after the exposed resist film was developed.

4. The double patterning method according to claim 1, wherein each of the first photoresist composition and the second photoresist composition includes a polymer that includes an acid-labile group that dissociates by an action of an acid to produce an acidic group, an acid generator, and a solvent.

5. The double patterning method according to claim 1, further comprising: bringing a basic compound into contact with a surface of the developed first resist film before the second resist film is exposed.

6. The double patterning method according to claim 5, wherein the first developer includes an organic solvent and the basic compound, and the basic compound is brought into contact with the surface of the developed first resist film while the exposed first resist film is developed using the first developer.

7. The double patterning method according to claim 6, wherein a content of the basic compound in the first developer is from 0.3 to 3 mass%.

8. The double patterning method according to claim 5, wherein the first resist film is rinsed using a rinsing agent after the exposed first resist film is developed, the rinsing agent includes the basic compound, and the basic compound is brought into contact with the surface of the developed first resist film while the first resist film is rinsed using the rinsing agent.

9. The double patterning method according to claim 8, wherein a content of the basic compound in the rinsing agent is from 0.3 to 3 mass%.

10. The double patterning method according to claim 5, wherein the second photoresist composition includes the basic compound, and the basic compound is brought into contact with the surface of the developed first resist film while the second resist film is provided in at least space areas of the first resist pattern using the second photoresist composition.

11. The double patterning method according to claim 10, wherein a content of the basic compound in the second photoresist composition is from 0.2 to 5 parts by mass, based on 100 parts by mass of a polymer included in the second photoresist composition.

12. The double patterning method according to claim 5, wherein the basic compound has higher basicity as compared with a conjugate base of the acidic group produced by dissociation of the acid-labile group included in the polymer.

13. The double patterning method according to claim 1, wherein each of the first resist pattern and the second resist pattern is a line-and-space pattern, and line areas of the first resist pattern and line areas of the second resist pattern are alternately disposed.

14. The double patterning method according to claim 1, wherein each of the first resist pattern and the second resist pattern is a line-and-space pattern, and line areas of the first resist pattern and line areas of the second resist pattern are disposed to perpendicularly intersect each other.

* * * * *